US012812969B2

(12) United States Patent
Wu et al.

(10) Patent No.: US 12,812,969 B2
(45) Date of Patent: Nov. 24, 2026

(54) TUNING WORK FUNCTIONS OF COMPLEMENTARY TRANSISTORS

(71) Applicant: Taiwan Semiconductor Manufacturing Co., Ltd., Hsinchu (TW)

(72) Inventors: Jyun-Yi Wu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 385 days.

(21) Appl. No.: 18/449,196

(22) Filed: Aug. 14, 2023

(65) Prior Publication Data

US 2024/0395817 A1 Nov. 28, 2024

Related U.S. Application Data

(60) Provisional application No. 63/504,228, filed on May 25, 2023.

(51) Int. Cl.
*H10D 84/85* (2025.01)
*H10D 30/01* (2025.01)
*H10D 30/62* (2025.01)
*H10D 64/01* (2025.01)
*H10D 84/01* (2026.01)
*H10D 84/03* (2025.01)

(52) U.S. Cl.
CPC ......... *H10D 84/853* (2025.01); *H10D 30/024* (2025.01); *H10D 30/6211* (2025.01); *H10D 64/017* (2025.01); *H10D 84/0193* (2025.01); *H10D 84/038* (2025.01)

(58) Field of Classification Search
CPC ............ H10D 84/853; H10D 30/6211; H10D 64/017; H10D 30/024; H10D 84/038; H10D 84/0193
See application file for complete search history.

(56) References Cited

U.S. PATENT DOCUMENTS 11,894,461 B2 2/2024 Chang et al.
11,990,522 B2 5/2024 Tung et al.
(Continued)

FOREIGN PATENT DOCUMENTS

TW 202238731 A 10/2022

*Primary Examiner* — Christine A Enad
(74) *Attorney, Agent, or Firm* — Slater Matsil, LLP

(57) ABSTRACT

A method includes forming a first gate stack including forming a first interfacial layer over a first semiconductor region, wherein the first interfacial layer has a first thickness; and forming a first high-k dielectric layer over the first interfacial layer, wherein the first high-k dielectric layer has a second thickness. The method further includes forming a second gate stack including forming a second interfacial layer over a second semiconductor region, wherein the second interfacial layer has a third thickness; and forming a second high-k dielectric layer over the second interfacial layer, wherein the second high-k dielectric layer has a fourth thickness. The thicknesses, dopants, and doping concentrations of the first interfacial layer and the second interfacial layer may be different from each other. The thicknesses, dopants, and doping concentrations of the first high-k dielectric layer and the second high-k dielectric layer may be different from each other.

20 Claims, 21 Drawing Sheets

(56) References Cited

U.S. PATENT DOCUMENTS

| | | | | |
|---|---|---|---|---|
| 2007/0023842 | A1* | 2/2007 | Jung | H01L 21/02181 257/E21.639 |
| 2012/0061772 | A1* | 3/2012 | Guo | H10D 64/517 257/410 |
| 2012/0306019 | A1 | 12/2012 | Cai et al. | |
| 2020/0058558 | A1* | 2/2020 | Chu | H10D 84/853 |
| 2021/0066137 | A1* | 3/2021 | Hsu | H10D 84/0181 |
| 2022/0108984 | A1 | 4/2022 | Huang et al. | |
| 2022/0310846 | A1 | 9/2022 | Chang et al. | |
| 2023/0019366 | A1* | 1/2023 | Chen | H01L 21/28202 |

* cited by examiner

TUNING WORK FUNCTIONS OF COMPLEMENTARY TRANSISTORS

PRIORITY CLAIM AND CROSS-REFERENCE

This application claims the benefit of the following provisionally filed U.S. Patent Application No. 63/504,228, filed on May 25, 2023, and entitled "Customized Gate Oxide Solutions for Multiple Device Application," which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, however, additional problems arise and should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
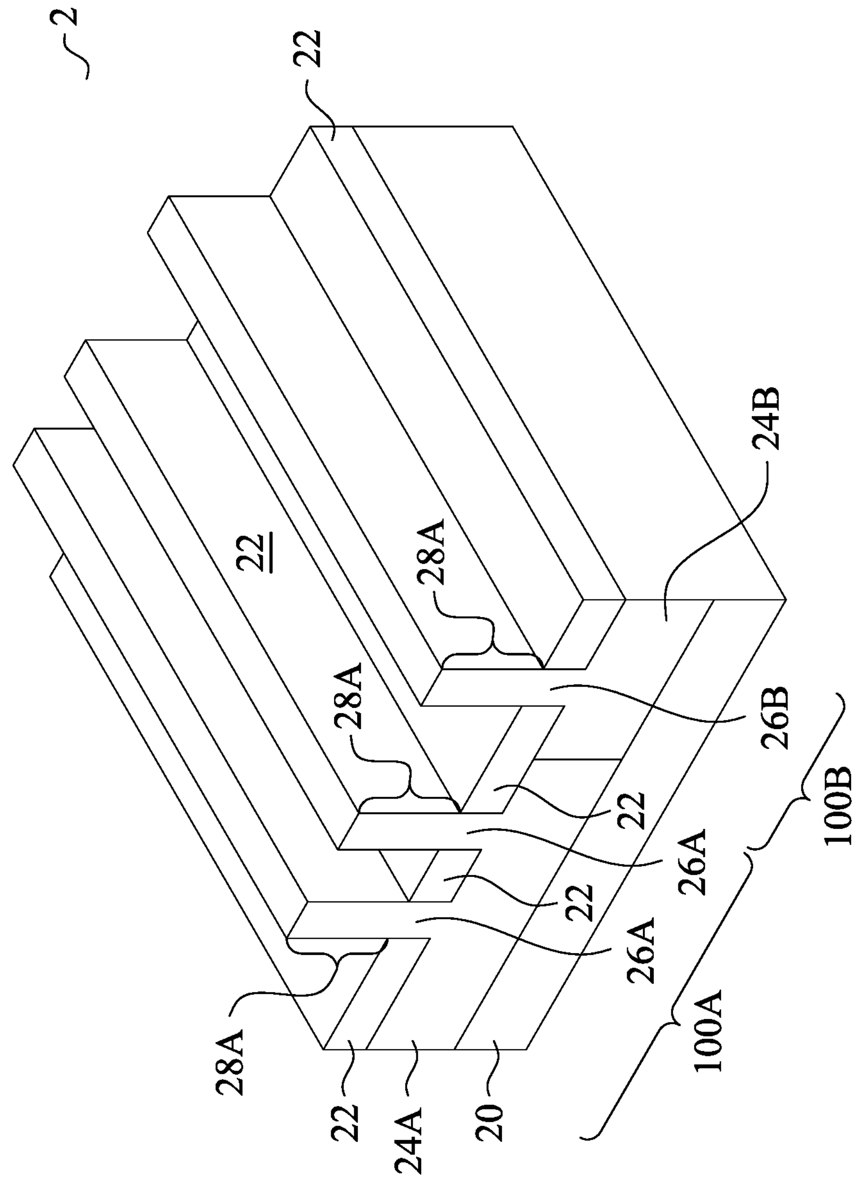
FIGS. 1-3, 4A, 4B, 5-15, 16A, 16B, and 17 illustrate the views of intermediate stages in the formation of a plurality of transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with different threshold voltages and the method of forming the same are provided. In accordance with some embodiments, a first transistor and a second transistor of a same conductivity type (n-type or p-type) may be formed to have different thicknesses of interfacial layers. The interfacial layers may be doped with a same dopant or different dopants, and to a same dopant concentration or different dopant concentrations. The high-k dielectric layers in the first transistor and the second transistor may have different thickness. The high-k dielectric layers may be doped with a same dopant or different dopants, and to a same dopant concentration or different dopant concentrations. Accordingly, with the interfacial layers (and/or high-k dielectric layers) having different thicknesses and/or dopants, the threshold voltages of the transistors may be adjusted to different levels.

Although Fin Field-Effect Transistors (FinFETs) are used as an example, the concept of the present disclosure may also be applied to other types of transistors such as planar transistors, Gate-All-Around (GAA) transistors, nanosheet transistors, nanowire transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 5-15, 16A, 16B, and 17 illustrate the views of intermediate stages in the formation of a plurality of transistors having different threshold voltages in accordance with some embodiments. The corresponding processes are also reflected schematically in the process flow shown in FIG. 18.

FIG. 1 illustrates a perspective view of an initial structure. The initial structure includes wafer 2 including substrate 20, which may be a semiconductor substrate. Substrate 20 may be a silicon substrate, a silicon germanium substrate, or a substrate formed of other semiconductor materials. Device region 100A and 100B are illustrated, in which complementary FinFETs are to be formed. In accordance with some embodiments, device region 100A includes a device region 100NA (FIG. 4B) for forming an nFET (which may be an n-type FinFET), and device region 100PA for forming a pFET (which may be a p-type FinFET). Device region 100B may also include a device region 100NB for forming an nFET (which may be an n-type FinFET), and device region 100PB for forming a pFET (which may be a p-type FinFET).

Referring again to FIG. 1, isolation regions 22 such as Shallow Trench Isolation (STI) regions may be formed to extend into substrate 20. The portions of substrate 20 between neighboring STI regions 22 are referred to as semiconductor strips 26, which include semiconductor strips 26A in device region 100A and semiconductor strips 26B in device region 100B. Well regions 24A and 24B are formed in device regions 100A and 100B, respectively, and extend into semiconductor strips 26A and 26B, respectively. The top portions of semiconductor strips 26 protruding higher than the top surfaces of STI regions 22 are referred to as protruding semiconductor fins 28, which include 28A and 28B in device regions 100A and 100B, respectively.

Figure 19:
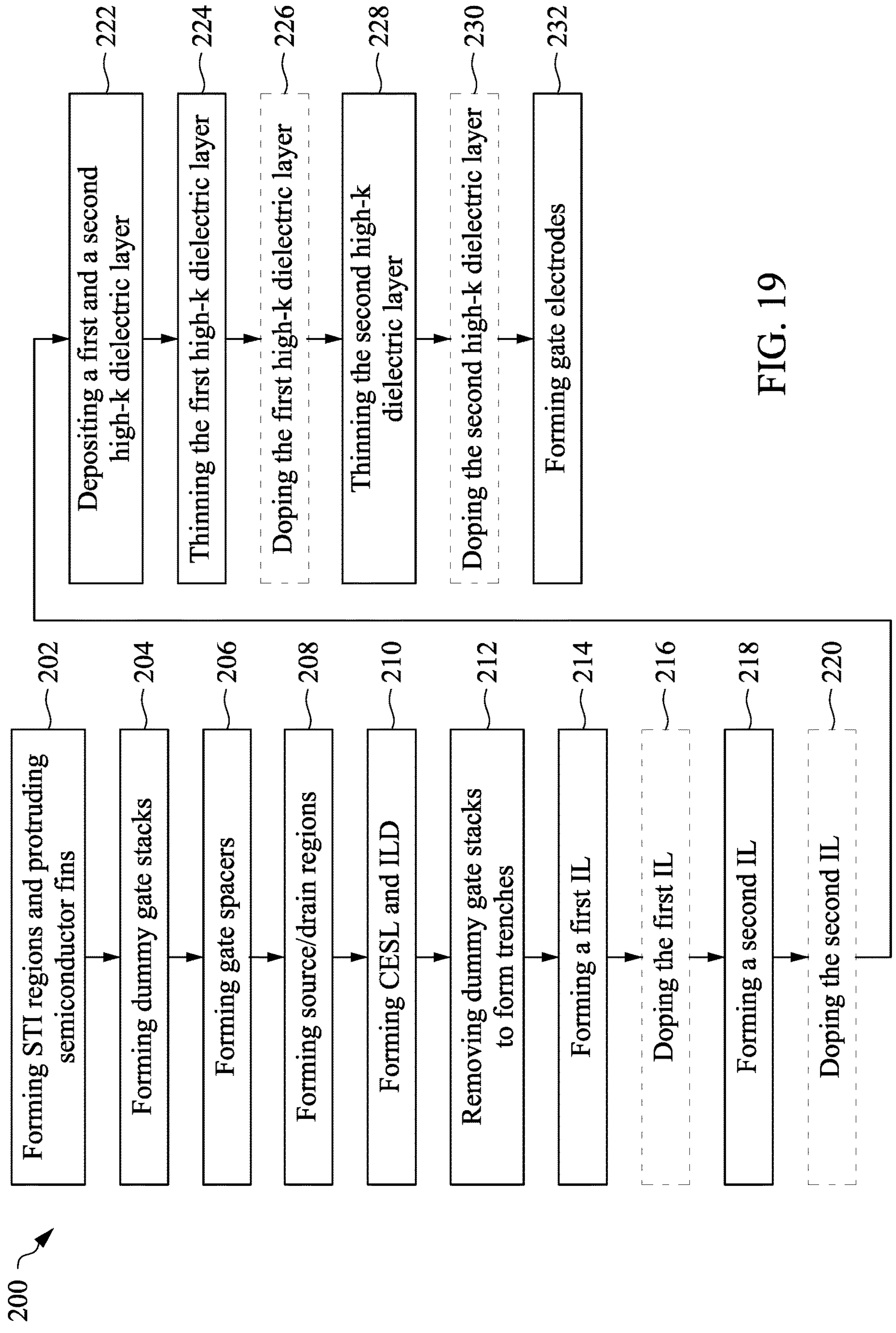
FIG. 19 illustrates a process flow for forming a plurality of transistors in accordance with some embodiments.

The formation of STI regions 22 and protruding semiconductor fins 28 may include recessing bulk semiconductor substrate 20 to form recesses, depositing dielectric materials into the recesses, planarizing the top surface of the semiconductor substrate 20 with the top surface of STI regions 22, and then recessing STI regions 22. The respective process is illustrated as process 202 in the process flow 200 as shown in FIG. 19.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 2:
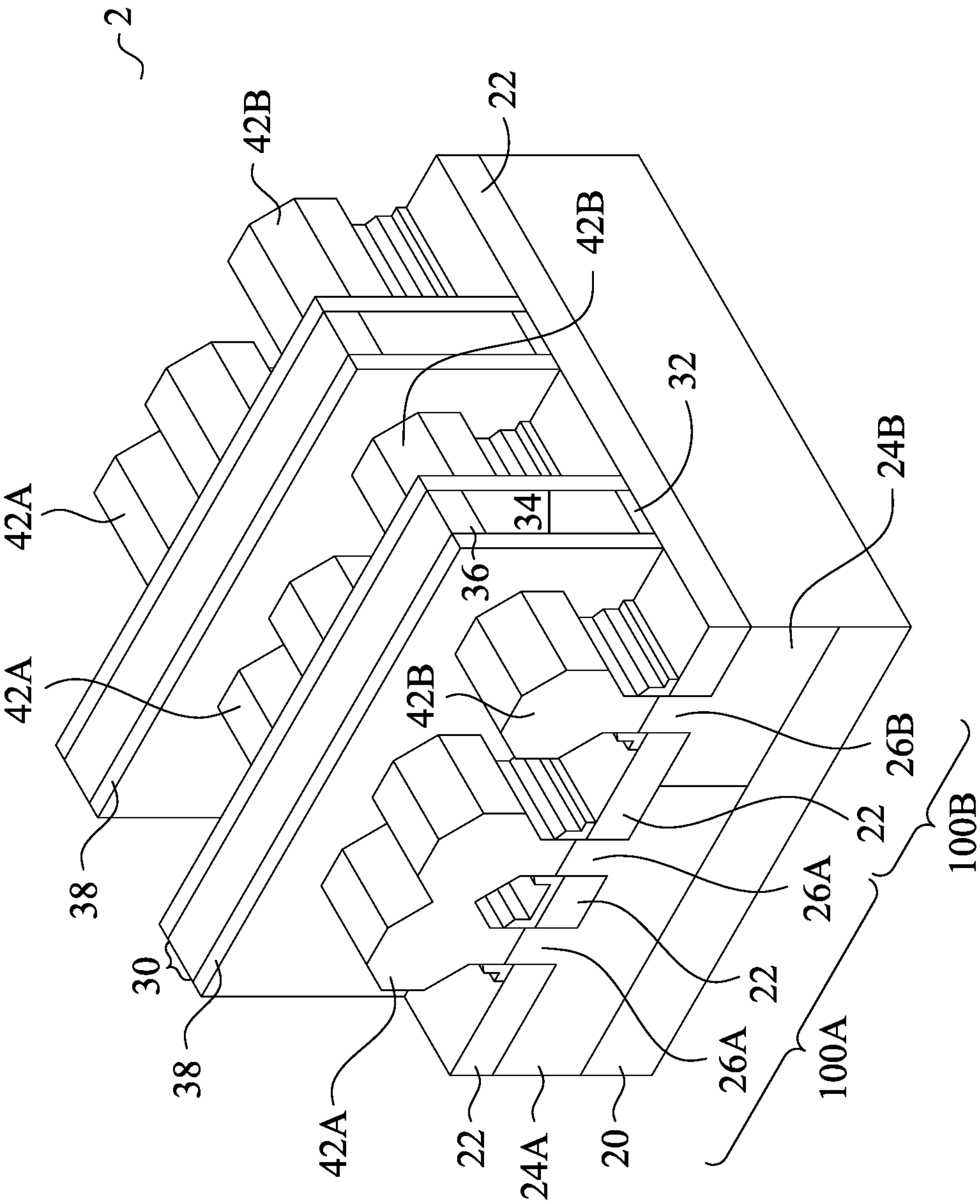

Referring to FIG. 2, dummy gate stacks 30 are formed on the top surfaces and the sidewalls of protruding fins 28A and 28B (FIG. 1). The respective process is illustrated as process 204 in the process flow 200 as shown in FIG. 19. Dummy gate stacks 30 may include dummy gate dielectrics 32 and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 28NA, 28NB, 28PA, and 28PB (as shown in FIG. 4B).

Next, as shown in FIG. 2, gate spacers 38 are formed on the sidewalls of dummy gate stacks 30. The respective process is illustrated as process 206 in the process flow 200 as shown in FIG. 19. In accordance with some embodiments, gate spacers 38 are formed of dielectric materials such as silicon carbon-oxynitride (SiCN), silicon nitride, silicon oxy-carbon-oxynitride (SiOCN), or the like, and may have a single-layer structure or a multi-layer structure including a plurality of dielectric layers.

FIG. 2 also illustrates the processes for forming source/drain regions 42A in device region 100A and source/drain regions 42B in device region 100B. The respective process is illustrated as process 208 in the process flow 200 as shown in FIG. 19. In accordance with some embodiments in which device regions 100A and 100B are n-type region and p-type region, respectively, source/drain regions 42A and source/drain regions 42B are of n-type and p-type, respectively. The formation of source/drain regions 42A may include recessing the portions of protruding fins 28A that are not covered by gate spacers 38 and dummy gate stacks 30 to form recesses, and epitaxially growing a corresponding semiconductor material (an n-type semiconductor material, for example) from the recesses. The formation of source/drain regions 42B may include recessing the portions of protruding fins 28B that are not covered by gate spacers 38 and dummy gate stacks 30 to form recesses, and epitaxially growing a corresponding semiconductor material (a p-type semiconductor material, for example) from the recesses.

Figure 3:
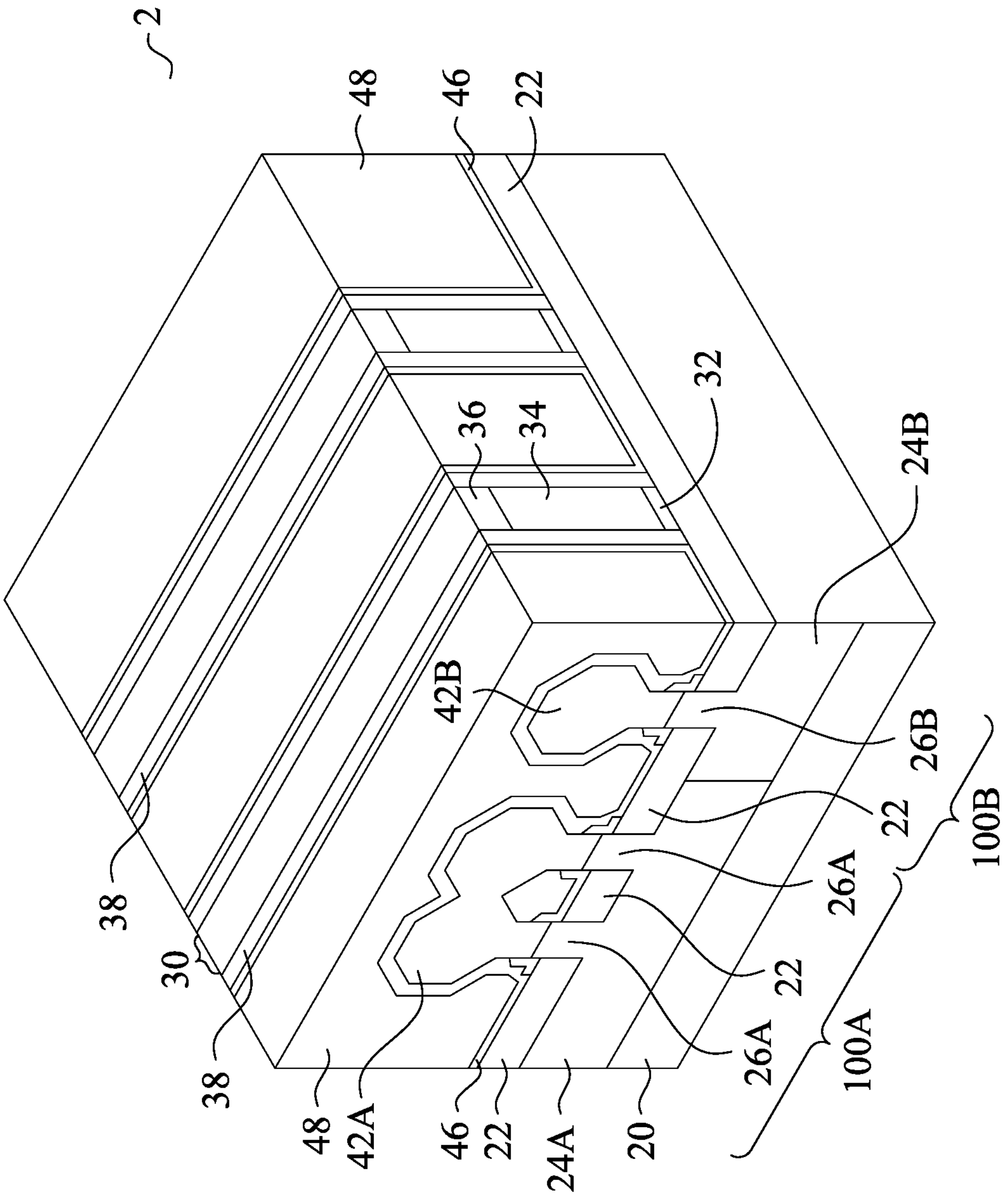

Next, referring to FIG. 3, Contact Etch Stop Layer (CESL) 46 and Inter-Layer Dielectric (ILD) 48 are formed. The respective process is illustrated as process 210 in the process flow 200 as shown in FIG. 19. In accordance with some embodiments, CESL 46 may be formed of or comprise silicon oxide, silicon nitride, silicon carbide, silicon carbonitride, or the like, or combinations thereof. ILD 48 may also be formed of an oxygen-containing dielectric material, which may be a silicon-oxide based dielectric material such as silicon oxide, Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, CESL 46, dummy gate stacks 30, and gate spacers 38 with each other.

Figure 4A:
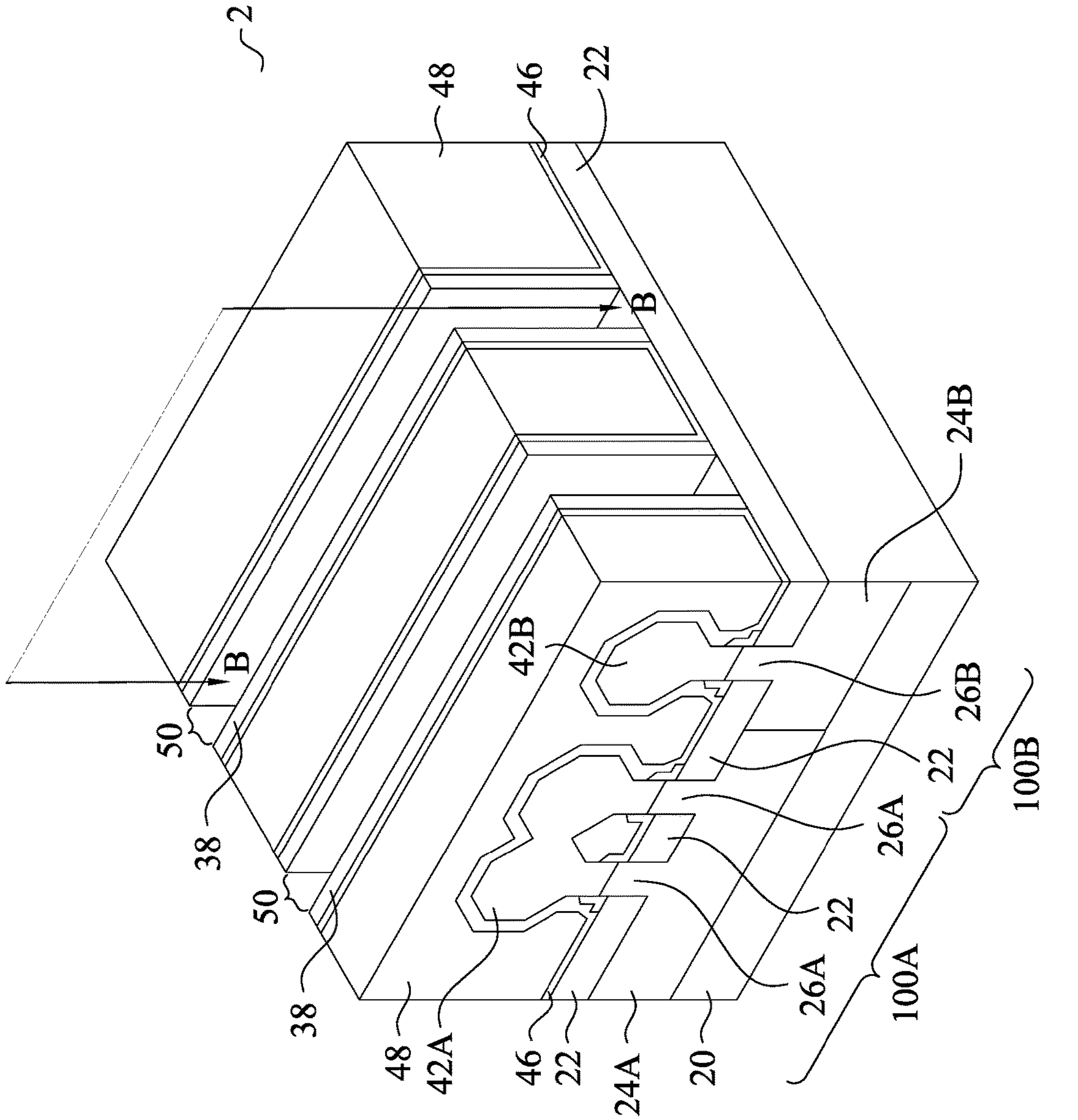
Figure 4B:
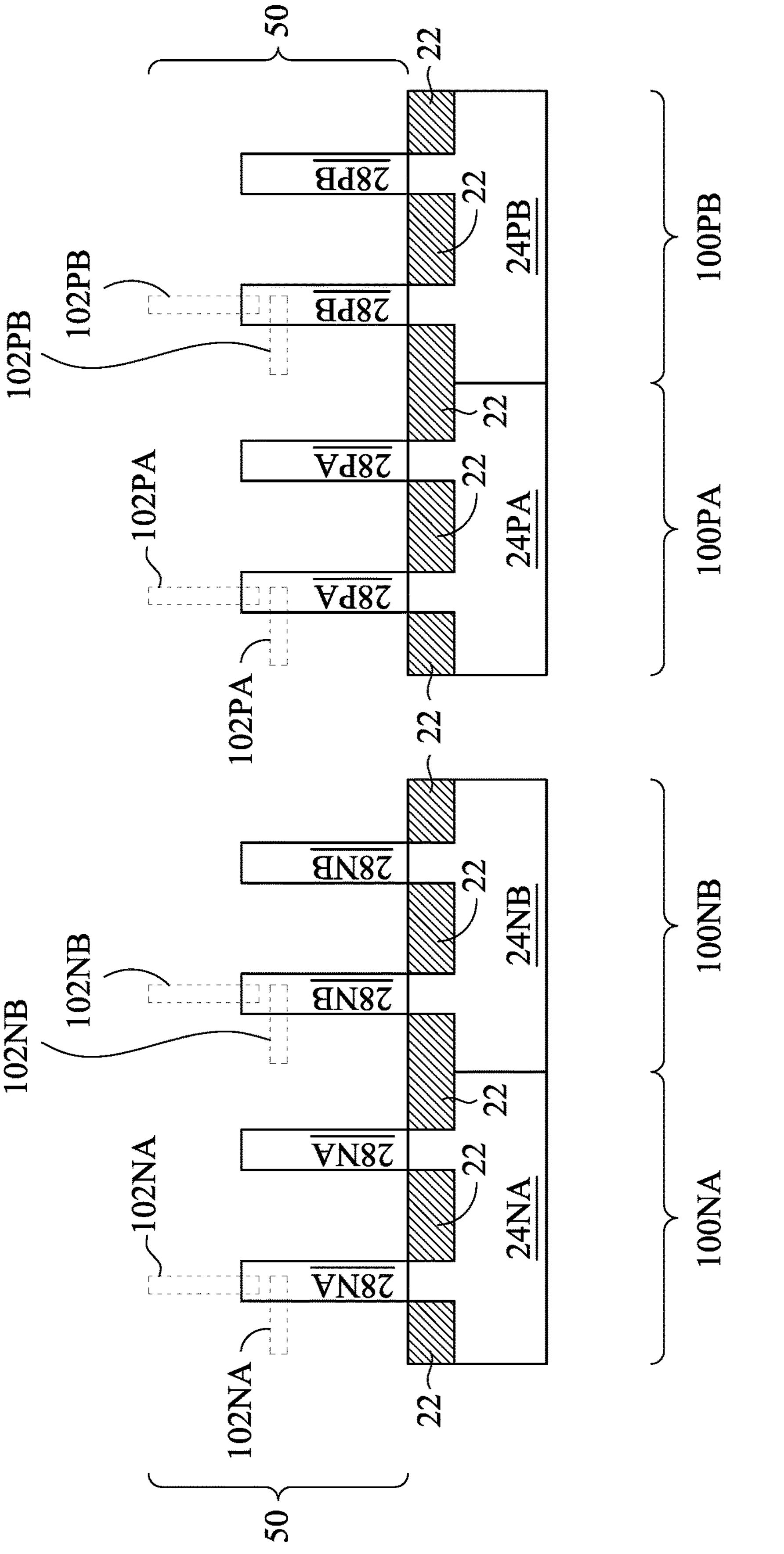

Dummy gate stacks 30 are then removed, hence form trenches 50 between gate spacers 38, as shown in FIG. 4A. The respective process is illustrated as process 212 in the process flow 200 as shown in FIG. 19. The removal of dummy gate stacks 30 may include a plurality of etching processes. The etching processes are performed until the underlying protruding semiconductor fins 28A (including 28NA and 28PA, FIG. 4B) and 28B (including 28NB and 28PB) are exposed.

FIG. 4B illustrates cross-sectional views of the structure shown in FIG. 4A, with an example cross-section B-B in FIG. 4A illustrated. The cross-section passes through the trenches 50 of a plurality of device regions. Protruding fins 28NA, 28NB, 28PA and 28PB are underlying, and are exposed to, the respective trenches 50. Protruding fins 28NA, 28NB, 28PA, and 28PB form a first fin group, a second fin group, a third fin group, and a fourth fin group, respectively. Protruding fins 28NA, 28NB, 28PA, and 28PB are for forming a first nFET, a second nFET, a first pFET, and a second pFET, respectively. The fin groups are separated from each other by STI regions 22.

The transistors in device regions 100NA and 100NB may be the same type of transistors. For example, both of the transistors in device regions 100NA and 100NB may be logic transistors, SRAM transistors, or IO transistors. Similarly, the transistors in device regions 100PA and 100PB may be the same type of transistors. In accordance with some embodiments, the transistors in device regions 100NA, 100NB, 100PA, and 100PB are in a same circuit, for example, and interconnected to form two inverters, which may further collectively form a latch. The latch that includes the four transistors may be in a same SRAM cell.

FIGS. 5-15, 16A, 16B, and 17 illustrate a brief process for forming replacement gate stacks of transistors in accordance with some embodiments, so that the threshold voltages of the transistors may be adjusted to desirable values. The structures shown in device region 100NA, 100NB, 100PA, and 100PB as shown in FIGS. 5-15 and 16A may represent the corresponding structure in regions 102A or 102B (FIG. 4B).

Figure 5:
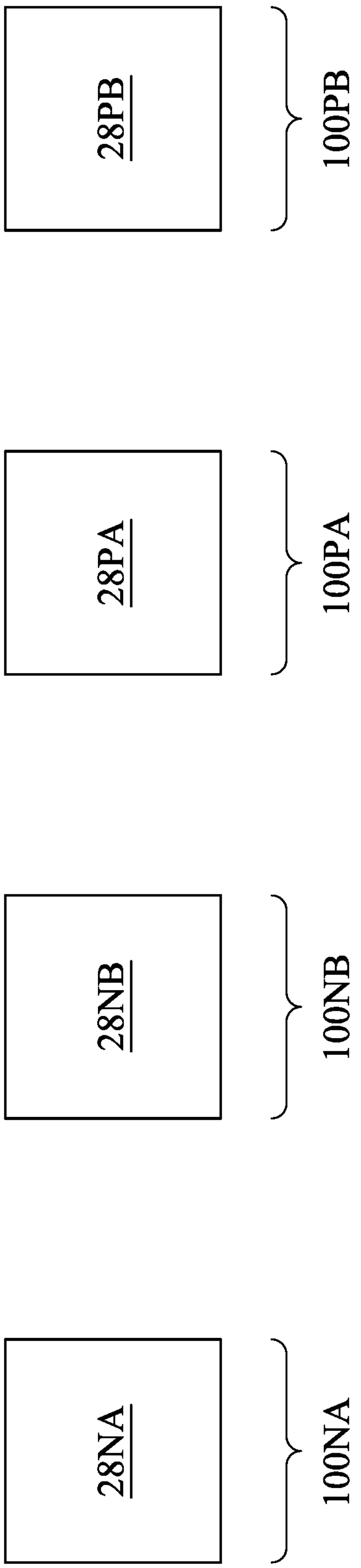

FIG. 5 illustrates some portions of semiconductor regions 28NA, 28NB, 28PA, and 28PB, which may be protruding semiconductor fins in accordance with some embodiments. Each of semiconductor regions 28NA, 28NB, 28PA, and 28PB may be formed of a material selected from silicon, silicon germanium, a III-V compound semiconductor, or the like.

Next, as shown in FIGS. 6 through 9, Interfacial Layers (ILs) 54NA, 54NB, 54PA, and 54PB are formed on semiconductor regions 28NA, 28NB, 28PA, and 28PB, respectively. ILs 54NA, 54NB, and 54PA, and 54PB are collectively referred to as ILs 54. It is appreciated that although FIGS. 6-9 illustrate that each of the ILs 54NA, 54NB, and 54PA, and 54PB is formed in a process separated from the formation of other ones of these ILs, some of these ILs 54 may be formed in common processes, depending on the desirable threshold voltages. For example, some (in any combination) or all of the ILs 54NA, 54NB, and 54PA, and 54PB may be formed in a common oxidation process, and some (in any combination) or all of the ILs 54NA, 54NB, and 54PA, and 54PB may be doped with a dopant in a common doping process.

Figure 6:
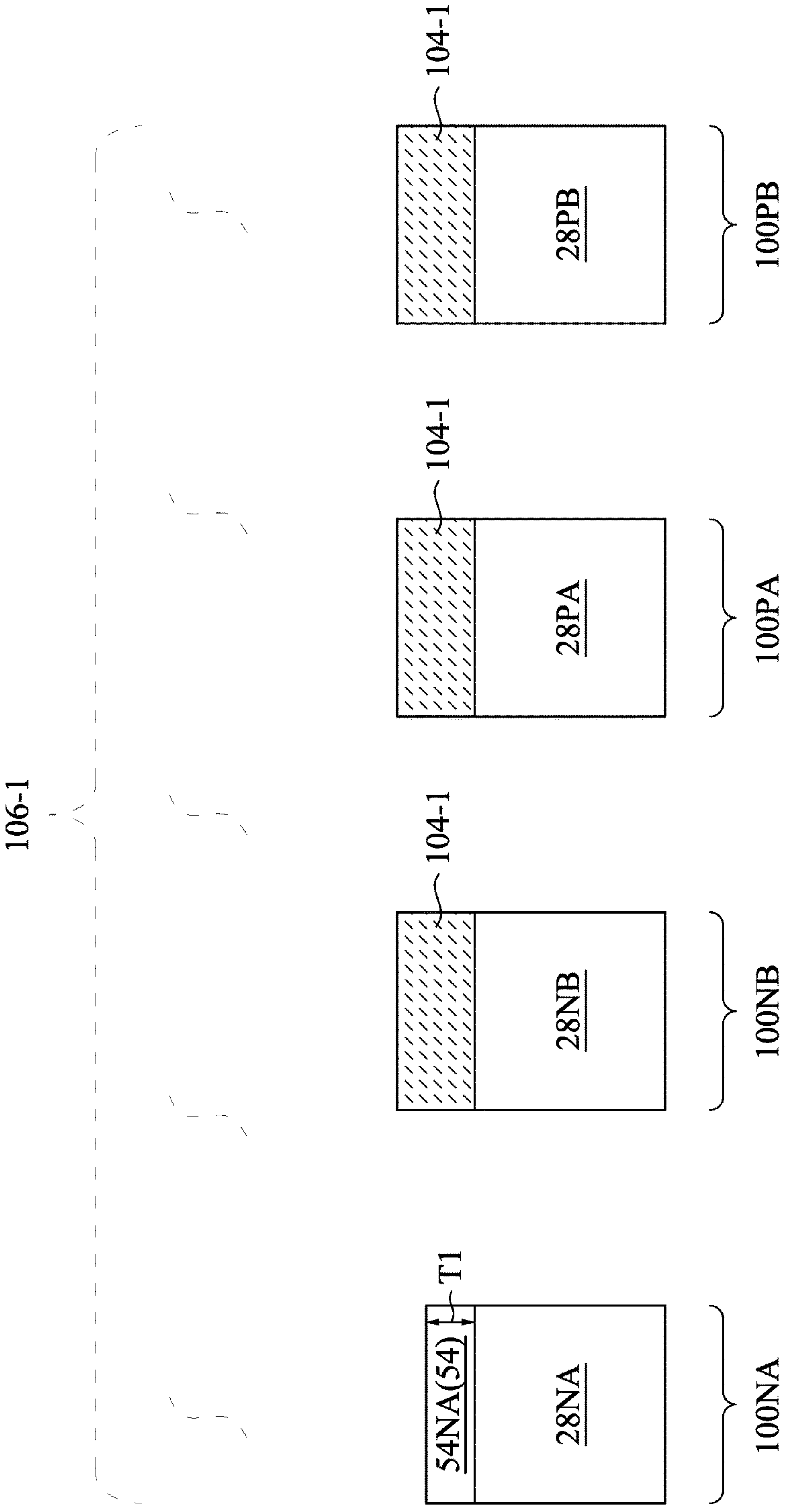
Figure 7:
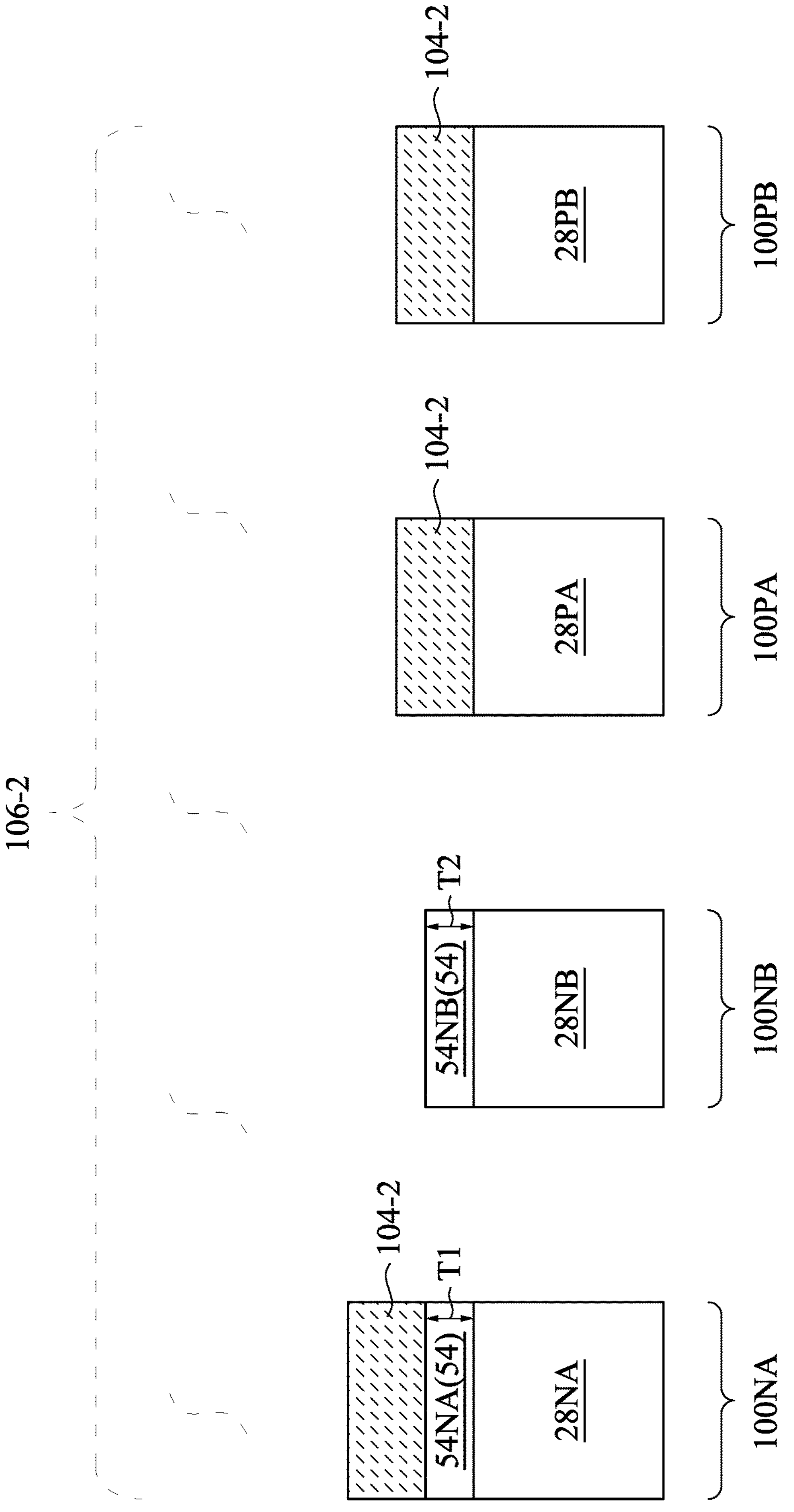

Referring to FIG. 6, mask layer 104-1 is formed to cover device regions 100NB, 100PA, and 100PB. Mask layer 104-1 may be formed of or comprise TiN, TaN, SiN, CON, or the like. An etching mask such as a patterned photoresist (not shown) may be formed over mask layer 104-1 in order to pattern mask layer 104-1, followed by the removal of the etching mask.

Next, IL 54NA is formed. The respective process is illustrated as process 214 in the process flow 200 as shown in FIG. 19. In accordance with some embodiments, IL 54NA is formed through oxidation, so that a surface layer of semiconductor region 28NA is oxidized. The resulting IL 54NA may comprise silicon oxide, silicon germanium oxide, or the like. In accordance with alternative embodiments, the formation of IL 54NA may include depositing a blanket IL layer, which may comprise silicon oxide, silicon oxynitride, a silicate such as $La_2SiO_5$, or the like, and performing a patterning process to remove the portion of the deposited IL layer from device regions 100NB, 100PA, and 100PB. IL 54NA has thickness T1, which may be in the range between about 0.5 nm and about 2 nm.

In accordance with some embodiments, a doping process 106-1 is performed to dope a dopant into IL 54NA. The respective process is illustrated as process 216 in the process flow 200 as shown in FIG. 19. The doping concentration of the dopant in IL 54NA is denoted as DC-54NA. Throughout the description, when dopant concentrations in different layers are referred to or compared, the dopant concentrations may refer to the peak concentrations in the layers. In accordance with alternative embodiments, the doping process is not performed. Accordingly, doping process 106-1 is illustrated using dashed lines to indicate that it may be, or may not be, performed. The dopant has the function of adjusting the threshold voltage of the resulting nFET in device region 100NA, and/or may have the function of improving the time-dependent dielectric breakdown (TDDB) performance of the resulting transistor.

In accordance with some embodiments, the dopant comprises nitrogen (N), fluorine (F), or the like. For nFETs, nitrogen and fluorine may improve the TDDB performance of the resulting transistors, and may adjust the threshold voltages of the nFETs. In accordance with some embodiments, the doping process 106-1 includes a plasma treatment and/or a thermal treatment using a process gas comprising N or F, which process gases may include ($WF_6$), ammonia ($NH_3$), and/or the like. Hard masks 104-1 prevents the doping of the dopant into device regions 100NB, 100PA, and 100PB.

In accordance with alternative embodiments, the doping process 106-1 includes depositing a blanket dopant-containing layer comprising nitrogen and/or fluorine therein, removing the dopant-containing layer from device regions 100NB, 100PA, and 100PB, performing a drive-in process (such as an anneal process or a plasma treatment process) to drive the dopant into IL 54NA, and removing the dopant-containing layer. For example, the dopant-containing layer may be deposited using $WF_6$ as a precursor, so that a fluorine-containing tungsten layer is deposited. In the drive-in process, the fluorine in the fluorine-containing tungsten layer is diffused into IL 54NA.

In accordance with alternative embodiments, a p-type dipole dopant or an n-type dipole dopant is doped into IL 54NA. The n-type dipole dopant may include La, Sc, Er, Sr, Y, and/or the like, or combinations thereof. The p-type dipole dopant may include Al, Zn, Nb, and/or the like, or combinations thereof. The doping of the dipole dopant may also include depositing a dipole dopant containing layer, removing the dipole dopant containing layer from device regions 100NB, 100PA, and 100PB, performing a drive-in process (such as an anneal process) to drive the dipole dopant into IL 54NA, and removing the dipole dopant containing layer. The dipole dopant containing layer may comprise the oxide, the nitride, and/or the carbide of the aforementioned dipole dopants. When the n-type dipole dopant is doped, the threshold voltage of the respective nFET is reduced. When the p-type dipole dopant is doped, the threshold voltage of the respective pFET is increased.

In accordance with yet alternative embodiments, IL 54NA is deposited as a dipole dopant containing layer to the desirable thickness and comprising the desirable dipole dopant directly, so that no doping process is needed.

The mask layer 104-1 (FIG. 6) is removed, and mask layer 104-2 is formed, and is patterned to cover device regions 100NA, 100PA, and 100PB, leaving device region 100NB open. The material of mask layer 104-2 may be selected from the same group of candidate materials for forming mask layer 104-1. Next, IL 54NB is formed, and has thickness T2, which may also be in the range between about 0.5 nm and about 2 nm. The respective process is illustrated as process 218 in the process flow 200 as shown in FIG. 19. The material of IL 54NB may be selected form the same group of candidate materials of IL 54NA, and may be the same as or different from the material of IL 54NA.

Thicknesses T1 and T2 may be equal to each other or different from each other. For the nMOS device in device regions 100NA and 100NB, when a p-type work function material is used to form the work function layer, the thickness of the corresponding ILs affects the threshold voltage, and a thicker IL results in a higher threshold voltage, and vice versa. The effective work function of the IL formed of the p-type work function material, however, may be adjusted as having an n-type work function (lower than about 4.5 eV, for example). Accordingly, by adopting p-type work function material for the transistors in device regions 100NA and 100NB and making thicknesses T1 and T2 to be different from each other, the threshold voltages of the resulting transistors 150NA and 150NB (FIGS. 16A and 16B) may be adjusted to different values. On the other hand, when the work function layers of the nFETs have mid-work-functions (around 4.5 eV~4.6 eV) or n-type work-functions (smaller than about 4.5 eV), the difference in the thickness of the ILs may not result in the difference in the threshold voltages.

In accordance with some embodiments, doping process 106-2 is performed to dope a dopant into IL 54NB. The respective process is illustrated as process 220 in the process flow 200 as shown in FIG. 19. The doping concentration of the dopant in IL 54NB is denoted as DC-54NB. In accordance with alternative embodiments, the doping process 106-2 is not performed. Accordingly, doping process 106-2 is illustrated using dashed lines to indicate that it may be, or may not be, performed. The dopant doped through doping process 106-2 has the function of adjusting the threshold voltage and/or improve TDDB performance of the resulting nFET in device region 100NB. The dopant of IL 54NA may also be selected from the same group of candidate dopants for doping IL 54NA, and may be the same dopant or different dopant from the dopant of IL 54NA. Furthermore, the doping concentration of IL 54NA may be the same as or different from the doping concentration of IL 54NB.

In accordance with yet alternative embodiments, IL 54NB (and the subsequently discussed ILs 54PA and 54PB) may be deposited as a dipole dopant containing layer directly to the desirable thickness and comprising the desirable dipole dopant, so that no doping process is needed.

Figure 8:
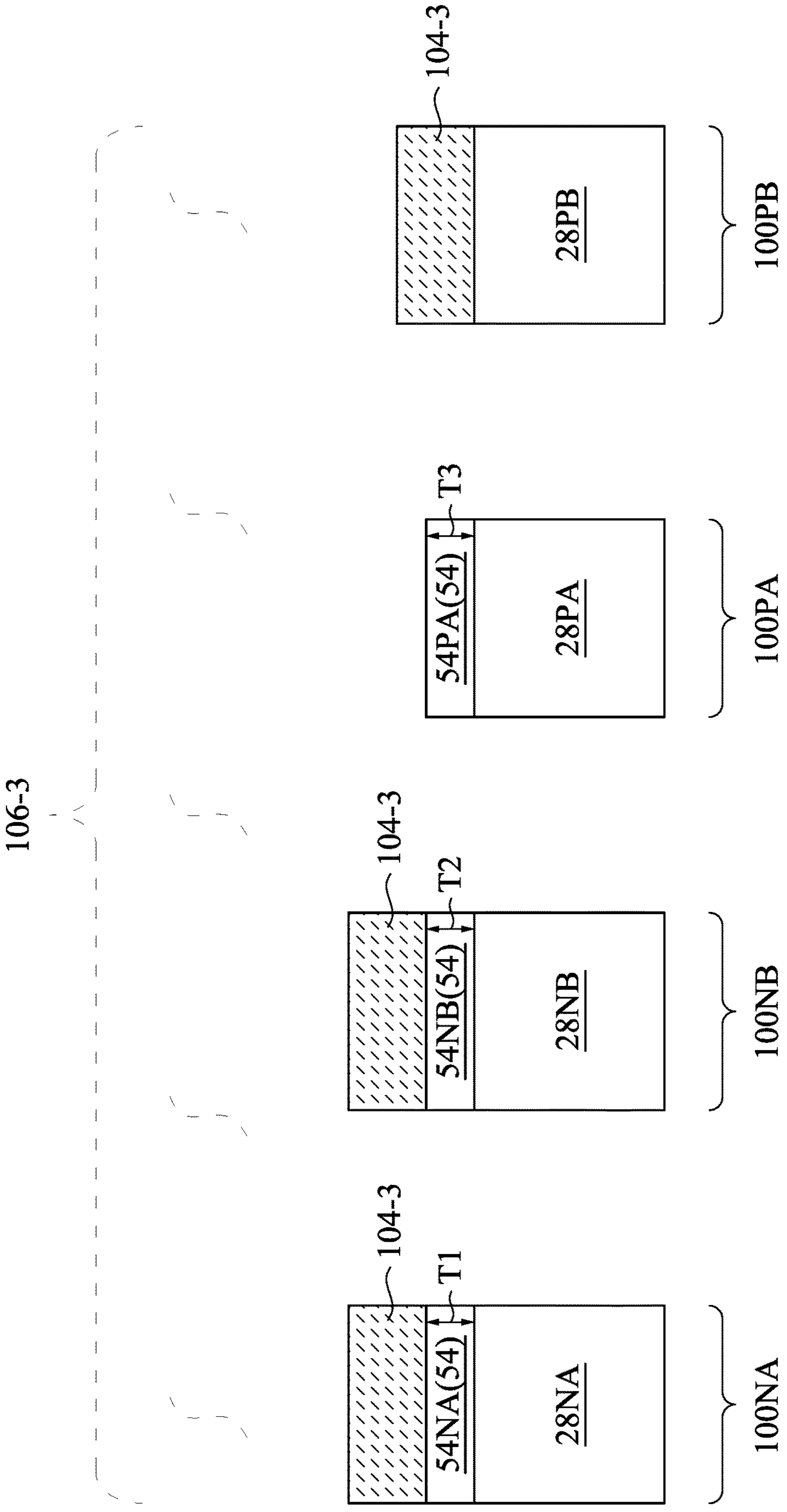

Referring to FIG. 8, the mask layer 104-2 (FIG. 7) is removed, and mask layer 104-3 is formed, and is patterned to cover device regions 100NA, 100NB, and 100PB, leaving device region 100PA open. The material of mask layer 104-3 may be selected from the same group of candidate materials for forming mask layer 104-1. Next, IL 54PA is formed, and has thickness T3, which may also be in the range between about 0.5 nm and about 2 nm. The material of IL 54PA may be selected form the same group of candidate materials of IL 54NA, and may be the same as or different from the material of IL 54NA.

In accordance with some embodiments, doping process 106-3 is performed to dope a dopant into IL 54PA. The doping concentration of the dopant in IL 54PA is denoted as DC-54PA. In accordance with alternative embodiments, the doping process 106-3 is not performed. Accordingly, doping process 106-3 is illustrated using dashed lines to indicate that it may be, or may not be, performed. The dopant doped through doping process 106-3 has the function of adjusting the threshold voltage of the resulting pFET in device region 100PA. The dopant of IL 54PA may also be selected from the same group of p-type dipole dopants or n-type dipole dopants for doping IL 54NA, and may be the same dopant as or a different dopant from the dopant of IL 54NA. Furthermore, the doping concentration of IL 54PA may be the same as or different from the doping concentration of IL 54NA.

Figure 9:
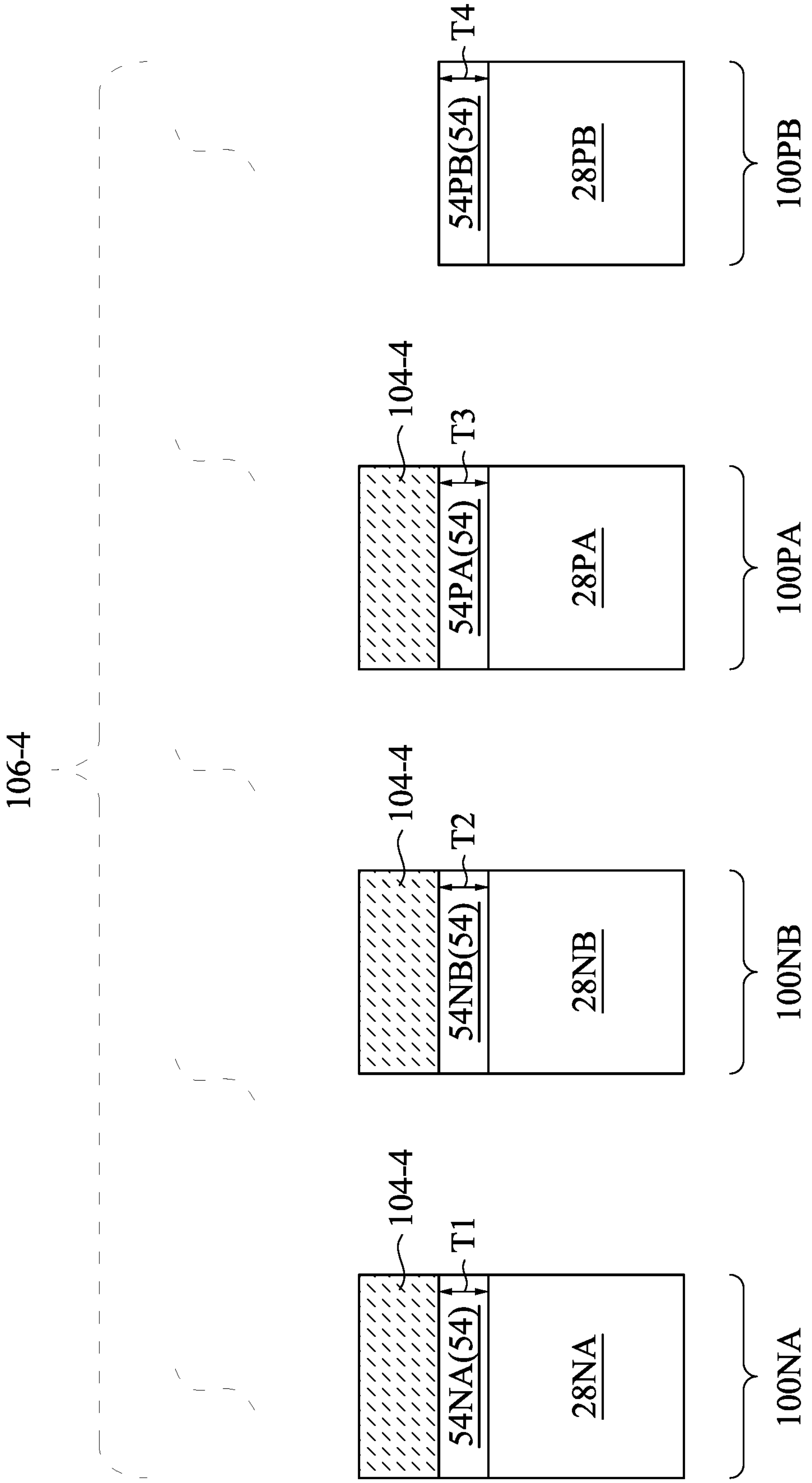

Referring to FIG. 9, the mask layer 104-3 (FIG. 8) is removed, and mask layer 104-4 is formed. Mask layer 104-4 is patterned to cover device regions 100NA, 100NB, and 100PA, leaving device region 100PB open. The material of mask layer 104-4 may be selected from the same group of candidate materials for forming mask layer 104-1. Next, IL 54PB is formed, and has thickness T4, which may also be in the range between about 0.5 nm and about 2 nm. The material of IL 54PB may be selected form the same group of candidate materials of IL 54PA, and may be the same as or different from the material of IL 54PA.

Thicknesses T3 and T4 may be equal to each other or different from each other. When the work function layers of the resulting pFETs have p-type work functions (higher than about 4.6 eV), the change in the thickness may also result in the change of the threshold voltage of the corresponding transistor. A greater thickness, however, will result in a lower threshold voltage, and vice versa, contrary to the nFETs. Otherwise, when the work function layers of the resulting pFETs have mid-work-functions or n-type work-functions, the difference in the thickness of the ILs may not result in the difference in the threshold voltages.

In accordance with some embodiments, each of the thicknesses T1, T2, T3, and T4 may be equal to or different from any of the other ones of thicknesses T1, T2, T3, and T4 in any combination. This results in the adjustment of threshold voltages of the corresponding transistors.

In accordance with some embodiments, doping process 106-4 is performed to dope a dopant into IL 54PB. The doping concentration of the dopant in IL 54PB is denoted as DC-54PB. In accordance with alternative embodiments, the doping process 106-4 is not performed. Accordingly, doping process 106-4 is illustrated using dashed lines to indicate that it may be, or may not be, performed. The dopant of IL 54PB may also be selected from the same group of candidate dopants for doping IL 54PA, and may be the same dopant or different dopant from the dopant of IL 54PA.

The dopant may include a p-type dipole dopant or an n-type dopant, as aforementioned. Furthermore, each of the doping concentrations DC-54NA, DC-54NB, DC-54PA, and DC-54PB may be the same as or different from the other ones of these doping concentrations in any combination to result in different levels of threshold voltage tuning.

In accordance with alternative embodiments, instead of doping ILs 54NA, 54NB, 54PA, and 54PB individually, the doping of some (in any combination) or all of the ILs 54NA, 54NB, 54PA, and 54PB may be performed in a same process, and hence some of these ILs will have the same dipole dopant, and have the same dipole dopant concentration.

FIGS. 10 through 15 illustrate the formation of high-k dielectric layers 56NA, 56NB, 56PA, and 56PB, which are collectively referred to as high-k dielectric layers 56, in accordance with some embodiments. The materials of high-k dielectric layers 56 may be selected from metal oxide, metal nitride, metal silicate, or the like. For example, the materials of high-k dielectric layers 56 may be selected from $HfO_x$ (such as $HfO_2$), $ZrO_x$, $LaO_x$, $AlO_x$, $ZnO_x$, $TiO_x$, or the like, or combinations thereof, wherein the x value represents the relative atomic ratio of oxygen to the corresponding metal. The formation process may include a conformal deposition process such as ALD or CVD.

The thicknesses of high-k dielectric layers 56NA, 56NB, 56PA, and 56PB are denoted as thicknesses T1', T2', T3', and T4' (FIG. 15), respectively. Each of the thicknesses T1', T2', T3', and T4' may be equal to or different from other ones of thicknesses T1', T2', T3', and T4' in any combination. Adjusting the thicknesses may result in the adjustment of threshold voltages, as discussed in subsequent paragraphs. In accordance with some embodiments, as shown in FIGS. 10-15, the formation of the high-k dielectric layers 56 include depositing the high-k dielectric layers to a same thickness, and then thinning some or all of the high-k dielectric layers 56 to desirable thicknesses. In accordance with alternative embodiments, high-k dielectric layers 56NA, 56NB, 56PA, and 56PB may be deposited directly to the desirable thicknesses T1', T2', T3', and T4', respectively.

Each of the high-k dielectric layers 56NA, 56NB, 56PA, and 56PB may be doped with a p-type dipole dopant or an n-type dipole dopant, which are selected from the same group of dipole dopants for doping the ILs. Furthermore, the dipole dopant concentration of each of the high-k dielectric layers 56NA, 56NB, 56PA, and 56PB may be equal to, higher than, or lower than, the dipole dopant concentration of other ones of the high-k dielectric layers 56, so that desirable level of threshold voltage adjustment may be achieved.

The processes as shown in FIGS. 10 through 15 are discussed briefly as follows. Some of the details such as the dopants may be found referring to the dopants of the ILs, and thus may not be discussed in detail herein.

Figure 10:
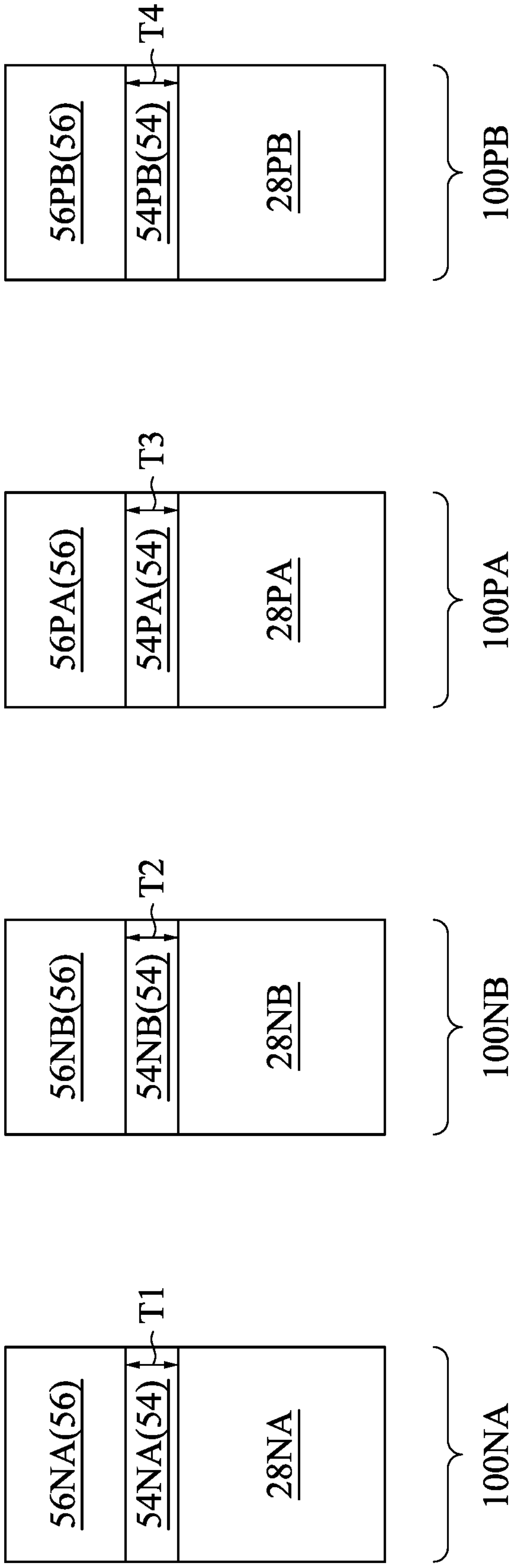

Referring to FIG. 10, high-k dielectric layers 56NA, 56NB, 56PA, and 56PB are deposited through a common deposition process, followed by a patterning process. The respective process is illustrated as process 222 in the process flow 200 as shown in FIG. 19. Accordingly, high-k dielectric layers 56NA, 56NB, 56PA, and 56PB comprise a same high-k dielectric material, as aforementioned. In accordance with some embodiments, the thicknesses of high-k dielectric layers 56NA, 56NB, 56PA, and 56PB are greater than about 5 nm, and may be in the range between about 5 nm and about 10 nm.

Figure 11:
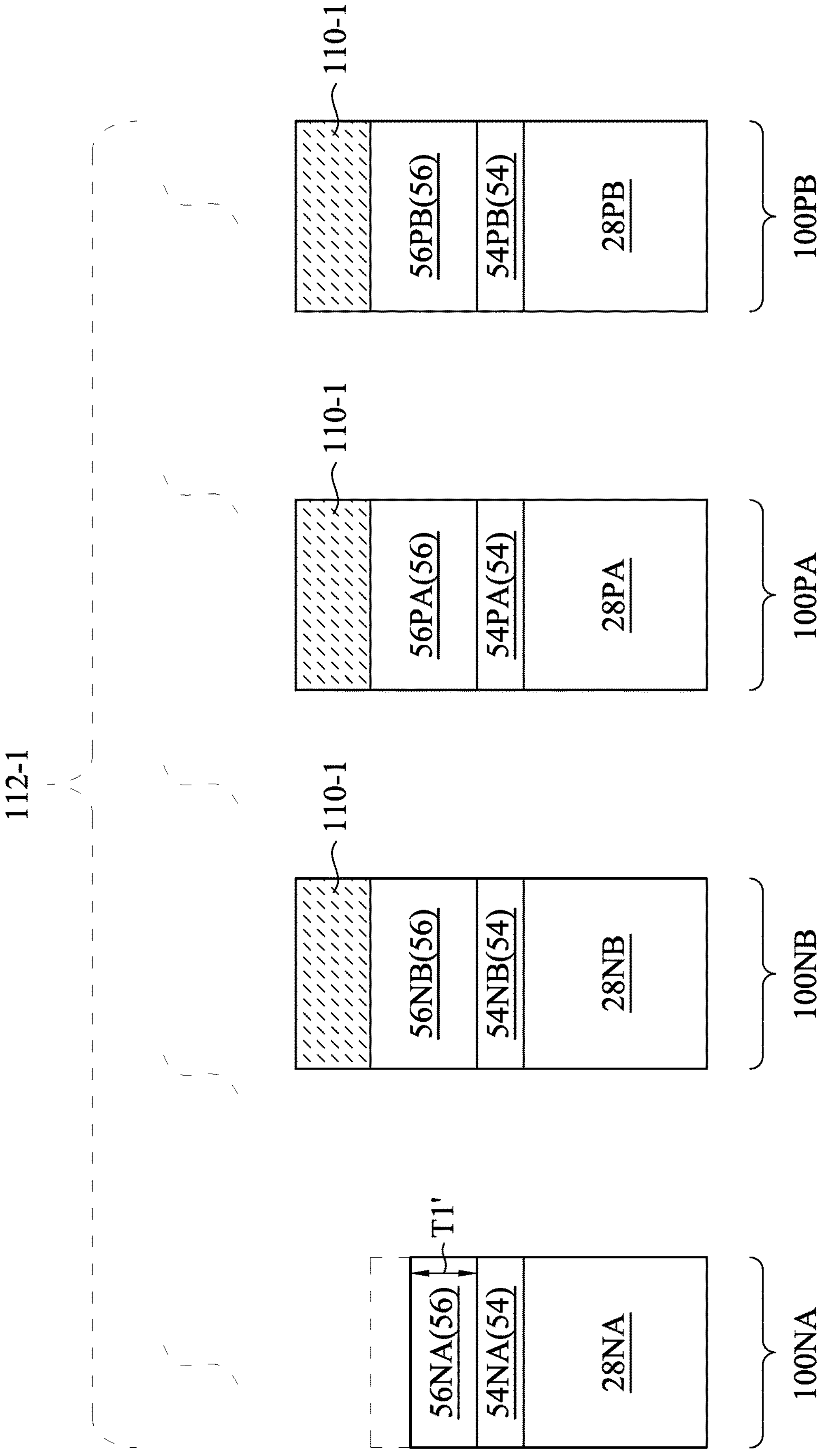

Next, referring to FIG. 11, mask layer 110-1 is formed and patterned. Mask layer 110-1 may include a hard mask, which may be formed of TiN, TaN, SiN, CON, or the like. Mask layer 110-1 may or may not include a patterned photoresist, depending on whether a plasma treatment or a thermal treatment will be included or not. Mask layer 110-1 covers device region 100NB, 100PA, and 100PB, and leaves device region 100NA open. High-k dielectric layer 56NA is then thinned through etching to have thickness T1', which may be in the range between about 1 nm and about 5 nm. The respective process is illustrated as process 224 in the process flow 200 as shown in FIG. 19.

In accordance with some embodiments, doping process 112-1 is performed to dope a dopant into high-k dielectric layer 56NA. The respective process is illustrated as process 226 in the process flow 200 as shown in FIG. 19. The dopant may include a p-type dipole dopant or an n-type dopant, as aforementioned, or another dopant such as N and/or F. The p-type dipole dopant will result in the increase of the threshold voltage of the corresponding nFET, and the n-type dipole dopant will result in the reduction of the threshold voltage of the corresponding nFET. The doping concentration is denoted as DC-56NA.

In accordance with alternative embodiments, the doping process 112-1 is not performed. Accordingly, doping process 112-1 is illustrated using dashed lines to indicate that it may be, or may not be, performed. The dipole dopant of high-k dielectric layer 56NA may also be selected from the same group of candidate dipole dopants for doping IL 54NA, and may be the same dopant as or different dopant from the dopant of IL 54NA. The details of the doping process may also be found from the discussion of the doping of the ILs 54.

Figure 12:
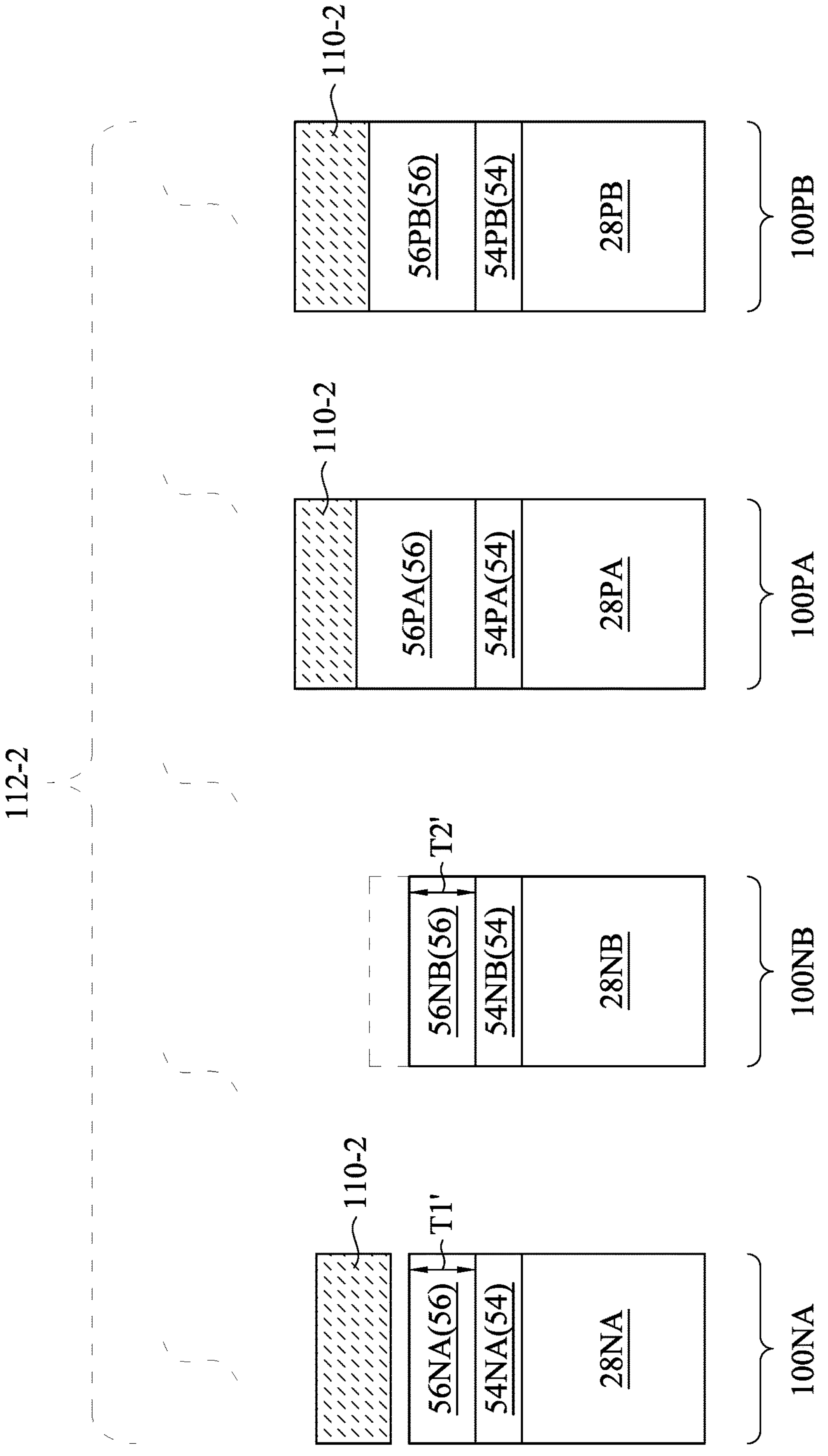

FIG. 12 illustrates the removal of mask layer 110-1 (FIG. 11), followed by the formation of mask layer 110-2. Mask layer 110-2 may be formed using the similar process and similar materials as that of mask layer 110-1. Mask layer 110-2 covers device region 100NA, 100PA, and 100PB, and leaves device region 100NB open. High-k dielectric layer 56NB is then thinned through etching to have thickness T2', which may be in the range between about 1 nm and about 5 nm. The respective process is illustrated as process 228 in the process flow 200 as shown in FIG. 19.

In accordance with some embodiments, doping process 112-2 is performed to dope a dopant into high-k dielectric layer 56NB. The respective process is illustrated as process 230 in the process flow 200 as shown in FIG. 19. The dopant may also include an n-type dipole dopant or a p-type dopant, depending on whether the doping is intended for the reduction or the increase, respectively, of the threshold voltage of the corresponding nFET. The dopant may also include nitrogen and/or fluorine. The doping concentration is denoted as DC-56NB.

In accordance with alternative embodiments, the doping process 112-1 is not performed. Accordingly, doping process 112-2 is illustrated using dashed lines to indicate that it may be, or may not be, performed. The dopant of high-k dielectric layer 56NB may also be selected from the same group of candidate dopants for doping IL 54NB, and may be the same dopant or a different dopant (either the same type or an opposite type) than the dopant of IL 54NB.

Figure 13:
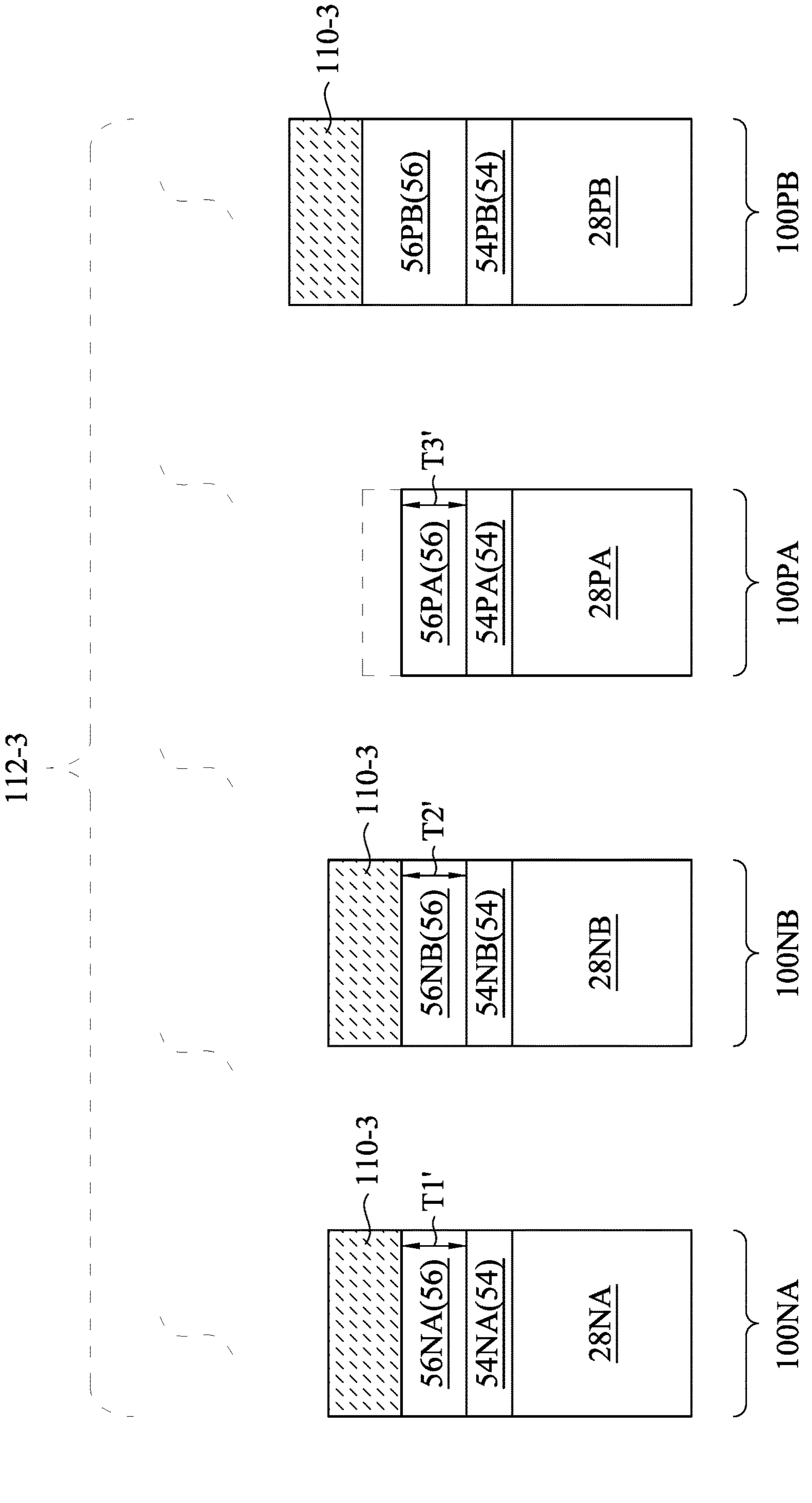

FIG. 13 illustrates the removal of mask layer 110-2 (FIG. 12), followed by the formation of mask layer 110-3. Mask layer 110-3 may be formed using the similar process and similar materials as that of mask layer 110-1. Mask layer 110-3 covers device region 100NA, 100NB, and 100PB, and leaves device region 100PA open. High-k dielectric layer 56PA is then thinned through etching to have thickness T3', which may be in the range between about 1 nm and about 5 nm.

In accordance with some embodiments, doping process 112-3 is performed to dope a dipole dopant into high-k dielectric layer 56PA. The dipole dopant may also include a p-type dipole dopant or an n-type dopant, depending on whether the doping is intended for the reduction or the increase of the threshold voltage of the corresponding pFET. The doping concentration is denoted as DC-56PA. In accordance with alternative embodiments, the doping process 112-3 is not performed. Accordingly, doping process 112-3 is illustrated using dashed lines to indicate that it may be, or may not be, performed. The dipole dopant of high-k dielectric layer 56PA may also be selected from the same group of candidate dipole dopants for doping IL 54PA, and may be the same dipole dopant as or a different dipole dopant (either same type or an opposite type) from the dopant of IL 54PA.

Figure 14:
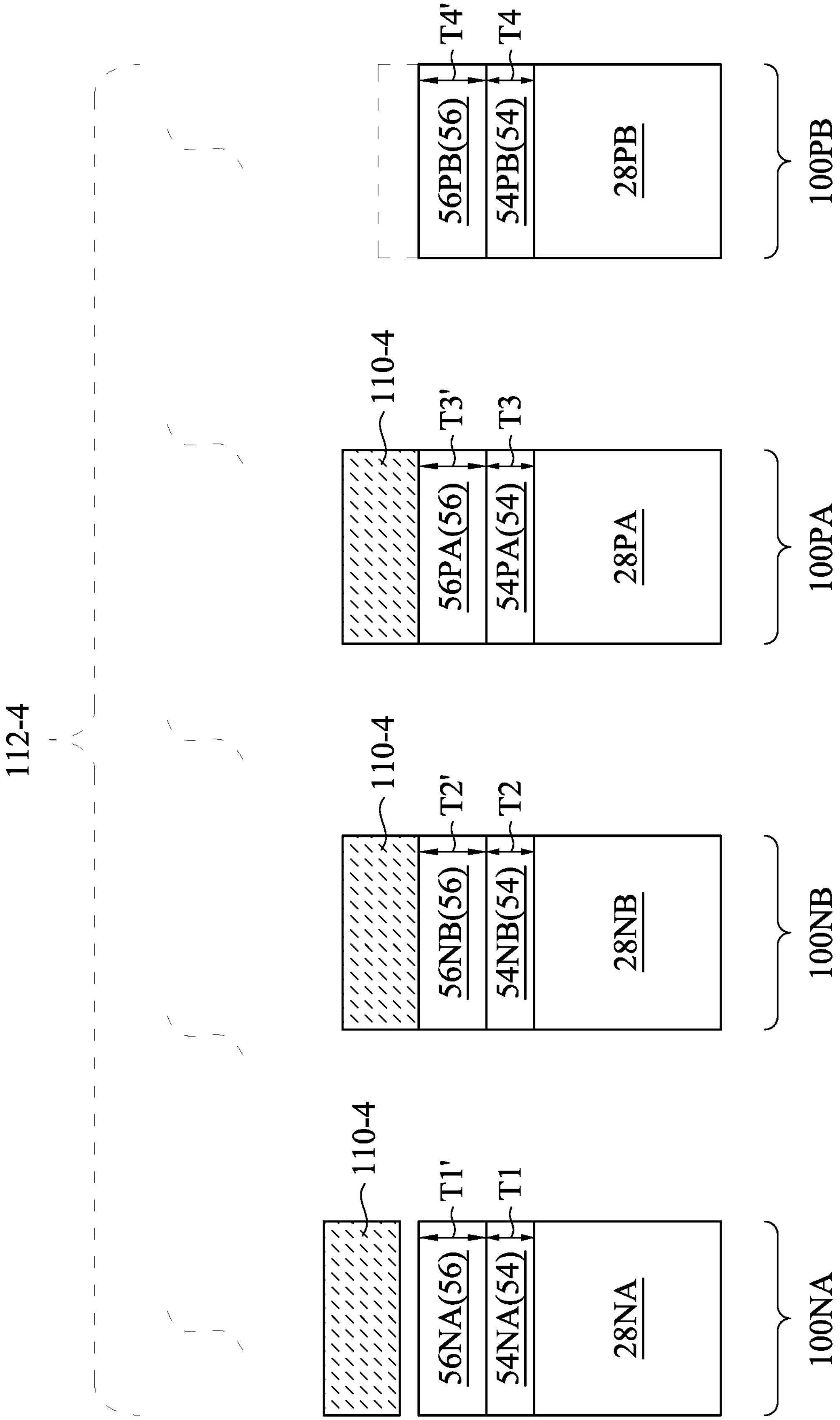
Figure 15:
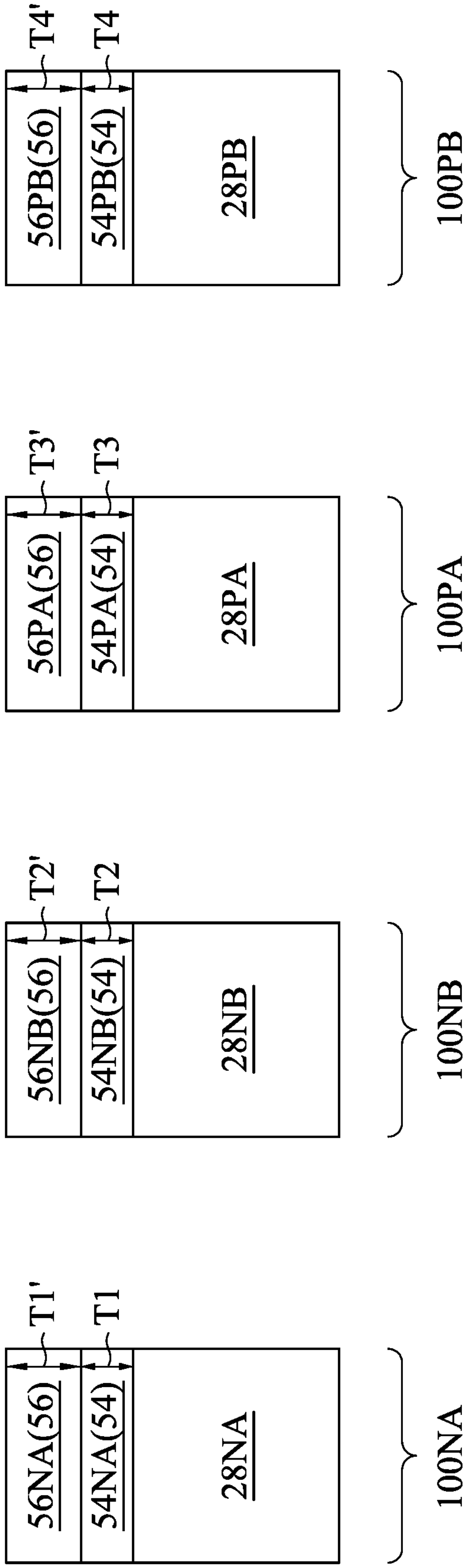

FIG. 14 illustrates the removal of mask layer 110-3 (FIG. 13), followed by the formation of mask layer 110-4. Mask layer 110-4 may be formed using the similar process and similar materials as that of mask layer 110-1. Mask layer 110-4 covers device region 100NA, 100NB, and 100PA, and leaves device region 100PB open. High-k dielectric layer 56PB is then thinned through etching to have thickness T4', which may be in the range between about 1 nm and about 5 nm.

In accordance with some embodiments, doping process 112-4 is performed to dope a dipole dopant into high-k dielectric layer 56PA. The dipole dopant may also include a p-type dipole dopant or an n-type dopant, depending on whether the doping is intended for the reduction or the increase of the threshold voltage of the corresponding pFET. The doping concentration is denoted as DC-56PB. In accordance with alternative embodiments, the doping process 112-4 is not performed. Accordingly, doping process 112-4 is illustrated using dashed lines to indicate that it may be, or may not be, performed. The dopant of high-k dielectric layer 56PB may also be selected from the same group of candidate dopants for doping IL 54PB, and may be the same dopant or different dopant (either same type or opposite type) from the dopant of IL 54PB. After the doping, mask layer 110-4 is removed.

In accordance with alternative embodiments, instead of doping high-k dielectric layers 56NA, 56NB, 56PA, and 56PB individually, the doping of some (in any combination) or all of high-k dielectric layers 56NA, 56NB, 56PA, and 56PB may be performed in a same process, and hence these high-k dielectric layers will have the same dopant, and have the same dipole dopant concentration.

Thicknesses T1' and T2' of the nFETs may be equal to each other or different from each other. When the resulting work function layers 62WFNA and 62WFNB (FIG. 16A) are formed of n-type work function (with work functions lower than about 4.6 eV), the change in the thicknesses is able to result in the change of the threshold voltages of the corresponding n-type transistors, and a greater thickness results in a higher threshold voltage, and vice versa. Otherwise, when the work function layers 62WFNA and 62WFNB (FIG. 16A) have mid-work-functions or p-type work-functions, the difference in the thickness of the high-k dielectric layers may not be able to result in the difference in the threshold voltages.

Thicknesses T3' and T4' of the pFETs may be equal to each other or different from each other. When the resulting work function layers 62WFPA and 62WFPB (FIG. 16A) are also formed of n-type work function materials, the change in the thicknesses may also result in the change of the threshold voltages of the corresponding p-type transistors, and a greater thickness results in a lower threshold voltage, and vice versa. Otherwise, when the work function layers 62WFNA and 62WFNB (FIG. 16A) of the work function layers have mid-work-functions or p-type work-functions, the difference in the thickness of the ILs may not result in the difference in the threshold voltages.

Furthermore, each of the doping concentrations DC-56NA, DC-56NB, DC-56PA, and DC-56PB may be the same as or different from the other ones of the doping concentrations in any combination to result in different levels of threshold voltage tuning.

In accordance with some embodiments, an IL selected from any of the ILs 54NA, 54NB, 54PA, and 54PB is doped with a dipole dopant of a same type as, or an opposite type than, the type of the dipole dopant doped into the respective overlying high-k dielectric layer 56. The opposing dipole dopant types may be used for either nFETs and/or pFETs. For example, when IL 54NA is doped with an n-type dipole dopant, the respective overlying high-k dielectric layer 56NA may be doped with an n-type dipole dopant or a p-type dipole dopant, or vice versa. When the dipole dopants in the IL and the overlying high-k dielectric layer are of a same type, the effects of increasing or reducing the threshold voltage are added to result in a more significant increase or reduction of the threshold voltage. Conversely, when the dipole dopants in the IL and the overlying high-k dielectric layer are of opposite types, the effects of increasing or reducing the threshold voltage are offset partially, resulting in another (lower) degree of threshold voltage tuning. The same type or different types of dopants compounded with different levels of dopant concentration levels may result in more levels of threshold voltage tuning.

Figure 16A:
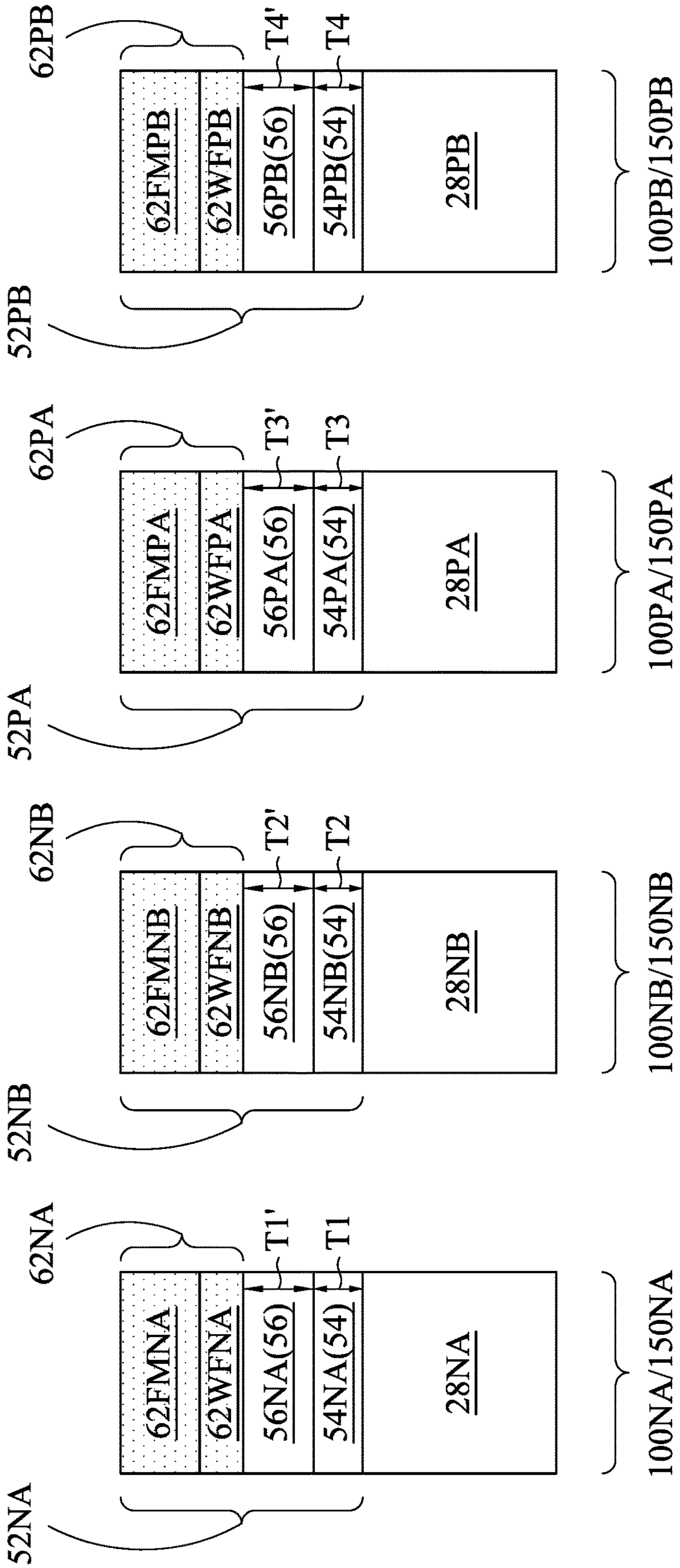

FIG. 16A illustrates the formation of gate electrodes 62NA, 62NB, 62PA, and 62PB in accordance with some embodiments. The respective process is illustrated as process 232 in the process flow 200 as shown in FIG. 19. Transistors 150NA, 150NB, 150PA, and 150PB are thus formed. Gate electrodes 62NA, 62NB, 62PA, and 62PB may comprise metal-containing materials such as titanium nitride, titanium oxide, tantalum nitride, tantalum carbide, tungsten, cobalt, ruthenium, aluminum, or the like, combinations thereof, and/or multi-layers thereof.

Gate electrodes 62NA, 62NB, 62PA, and 62PB include work function layers 62WFNA, 62WFNB, 62WFPA, and 62WFPB, respectively, and may or may not include filling metal layers 62WFNA, 62WFNB, 62WFPA, and 62WFPB, respectively. Each of the work function layers 62WFNA, 62WFNB, 62WFPA, and 62WFPB may be formed of an n-type work function material or a p-type work function material. It is appreciated that when p-type work function materials are used for n-type transistors 150NA and 150NB, their effective work function will be inverted to n-type work functions due to the doping of the respective ILs 54NA and 54NB and high-k dielectric layers 56NA and 56NB. Similarly, when n-type work function materials are used for p-type transistors 150PA and 150PB, their effective work function will be inverted to p-type work functions due to the doping of the respective ILs 54PA and 54PB and high-k dielectric layers 56PA and 56PB. In accordance with some embodiments, the p-type work function material may include TiN, and the n-type work function material may include AlN, TiAl, TiAlN, or the like.

Through the adjustment of threshold voltages, nFETs 150NA and 150NB may be formed as having different threshold voltages, with one being a low-Vt transistor, and the other being a high-Vt transistor. PFETs 150PA and 150PB may also be formed as having different threshold voltages, with one being a low-Vt transistor, and the other being a high-Vt transistor. It is appreciated the terms of low-Vt and high-Vt are relative to each other. The threshold voltages of these FETs (transistors) may be adjusted to be different from each other or equal to each other in any combination.

Figure 16B:
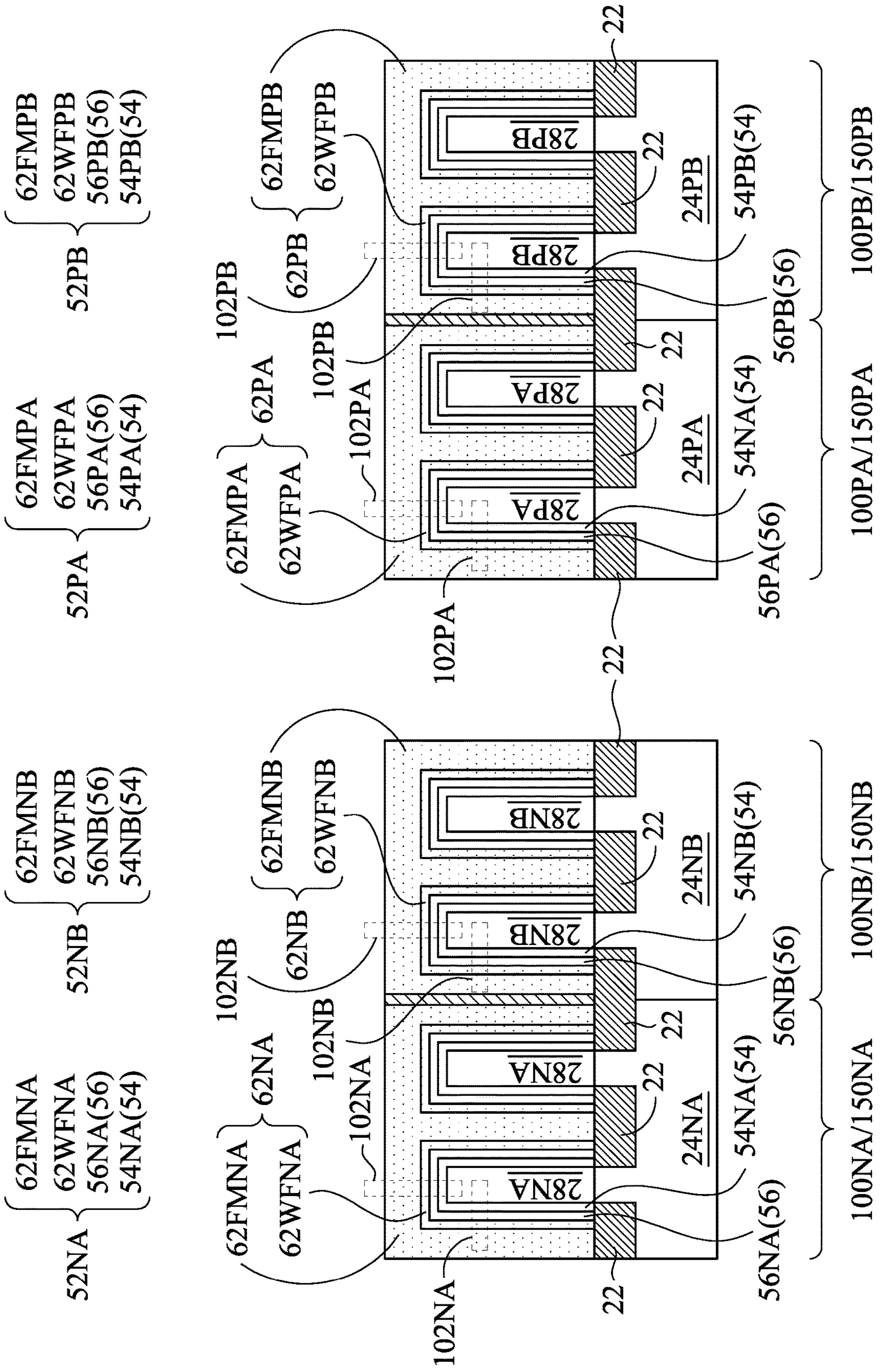

FIG. 16B illustrates the cross-sectional views of transistors based on the cross-sectional view shown in FIG. 4B, with the gate stacks 52NA, 52NB, 52PA, and 52PB being illustrated. The gate stacks include the ILs, high-k dielectric layers, and the corresponding gate electrodes.

Figure 17:
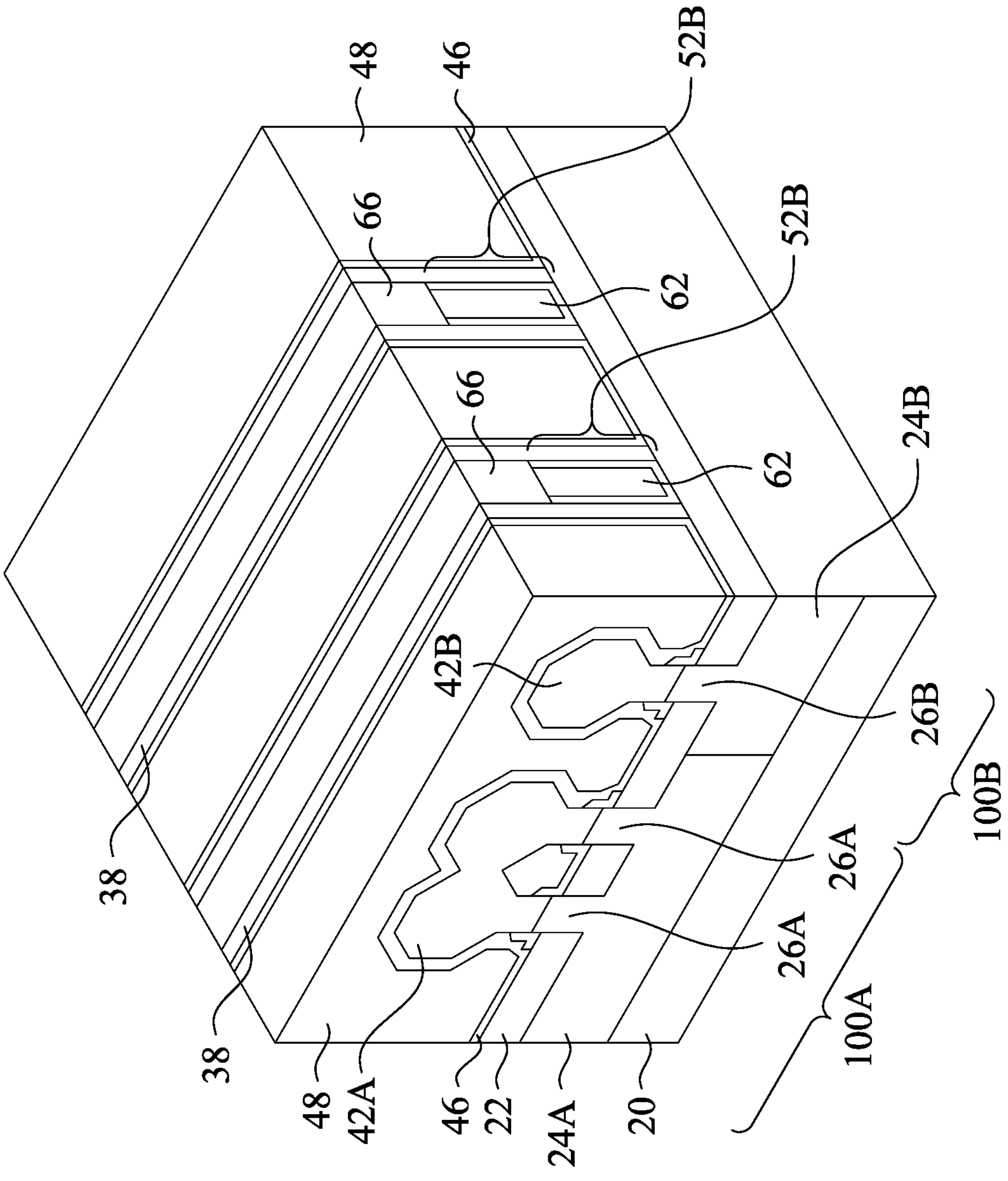

FIG. 17 illustrates a perspective view of two of the transistors. Gate stack 52B (representing 52NB or 52PB) is revealed, while gate stack 52A (representing 52NA or 52PA) is on the side that is not visible. After the process as shown in FIG. 16, gate stacks 52A and 52B are recessed through etching to form recesses. A dielectric material is then filled into the recesses, followed by an additional planarization process to remove the excess portions of the dielectric material higher than the top surfaces of ILD 48, so that self-aligned hard masks 66 are formed. In subsequent process, additional features (not shown) such as source/drain silicide regions, source/drain contact plugs, gate plugs, and the like are formed. Transistors 150A (representing 150NA or 150PA) and 150B (representing 150NB or 150PB) are thus formed.

Figure 18:
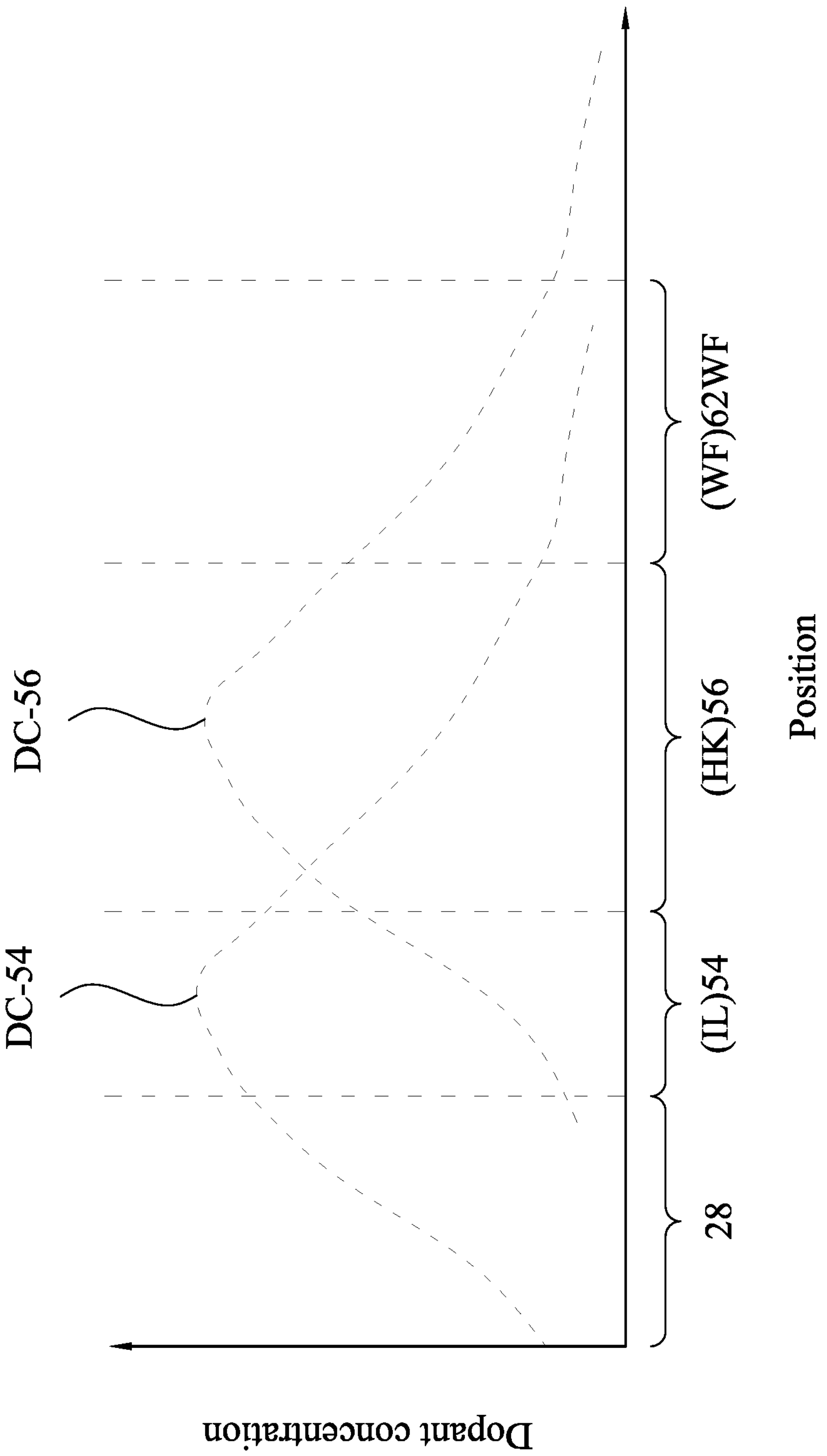
FIG. 18 illustrates a distribution profile of dopants in a gate stack in accordance with some embodiments.

FIG. 18 illustrates the distribution of the dipole dopant in a gate stack 52 (FIGS. 16A and 16B) in any of the transistors 150NA, 150NB, 150PA, and 150PB (FIGS. 16A and 16B) in accordance with some embodiments. The dopant concentration DC-54 (of the dopant doped during the formation of interfacial layer 54) and the dopant concentration DC-56 (of the dopant doped during the formation of high-k dielectric layer 56) are illustrated as the positions in semiconductor region 28, IL 54, high-k dielectric layer 56, and work function layer 62WF. The peak concentration of dopant concentration DC-54 may be inside (and may be in the middle of) IL 54, and the peak concentration of dopant concentration DC-56 may be inside (and may be in the middle of) high-k dielectric layer 56. The dopant having the dopant concentration DC-54 and the dopant having the dopant concentration DC-56 may have a same dipole dopant type or opposite dipole dopant types.

The embodiments of the present disclosure have some advantageous features. By adjusting the thicknesses of interfacial layers, the dopant and the doping concentrations in the interfacial layers, the thicknesses of high-k dielectric layers, and the dopant and the doping concentrations in the high-k dielectric layers, many levels of threshold voltages may be achieved. Furthermore, the different requirements of leakage, drain currents, and reliability may be met by tuning these process variables.

In accordance with some embodiments, a method comprises forming a first gate stack for a first transistor, wherein the first transistor has a first threshold voltage, and wherein the forming the first gate stack comprises forming a first interfacial layer over a first semiconductor region, wherein the first interfacial layer has a first thickness; and forming a first high-k dielectric layer over the first interfacial layer, wherein the first high-k dielectric layer has a second thickness; and forming a second gate stack for a second transistor, wherein the second transistor has a second threshold voltage different from the first threshold voltage, and wherein the forming the second gate stack comprises forming a second interfacial layer over a second semiconductor region, wherein the second interfacial layer has a third thickness; and forming a second high-k dielectric layer over the second interfacial layer, wherein the second high-k dielectric layer has a fourth thickness.

In an embodiment, the first transistor differs from the second transistor by a difference selected from the group consisting of a first difference between the first thickness and the second thickness, a second difference between the third thickness and the fourth thickness, a third difference between first dopants of the first interfacial layer and the second interfacial layer, a fourth difference between second dopants of the first high-k dielectric layer and the second high-k dielectric layer, and combinations thereof.

In an embodiment, the first interfacial layer and the second interfacial layers are formed by processes comprising forming a first mask layer covering the second semiconductor region; forming the first interfacial layer using the first mask layer for masking; forming a second mask layer covering the first semiconductor region; and forming the second interfacial layer using the second mask layer for masking. In an embodiment, the first high-k dielectric layer and the second high-k dielectric layer are formed by processes comprising depositing the first high-k dielectric layer and the second high-k dielectric layer in a common deposition process; forming a first mask layer covering the second high-k dielectric layer; thinning the first high-k dielectric layer using the first mask layer for masking; forming a second mask layer covering the first high-k dielectric layer; and thinning the second high-k dielectric layer using the second mask layer for masking.

In an embodiment, the first transistor differs from the second transistor by the first difference between the first thickness of the first interfacial layer and the third thickness of the second interfacial layer, and wherein the method further comprises forming p-type work function layers over the first high-k dielectric layer and the second high-k dielectric layer. the first transistor differs from the second transistor by the second difference between the third thickness of the first high-k dielectric layer and the fourth thickness of the second high-k dielectric layer, and wherein the method further comprises forming n-type work function layers over the first high-k dielectric layer and the second high-k dielectric layer.

In an embodiment, the first transistor differs from the second transistor by the third difference between first dopants of the first interfacial layer and the second interfacial layer. In an embodiment, the method further comprises doping the first interfacial layer with a first dipole dopant having a first dipole dopant concentration, and doping the second interfacial layer with a second dipole dopant having a second dipole dopant concentration different from the first dipole dopant concentration. In an embodiment, the method further comprises doping the first interfacial layer with a first dipole dopant having a first dipole dopant type, and doping the second interfacial layer with a second dipole dopant having a second dipole dopant type opposite the first dipole dopant type. In an embodiment, the first transistor differs from the second transistor by the fourth difference between second dopants of the first high-k dielectric layer and the second high-k dielectric layer.

In an embodiment, the method further comprises doping the first high-k dielectric layer with a first dipole dopant having a first dipole dopant concentration, and doping the second high-k dielectric layer with a second dipole dopant having a second dipole dopant concentration different from the first dipole dopant concentration. In an embodiment, the method further comprises doping the first high-k dielectric layer with a first dipole dopant having a first dipole dopant type, and doping the second high-k dielectric layer with a second dipole dopant having a second dopant type opposite the first dipole dopant type.

In accordance with some embodiments, a device comprises a first semiconductor region and a second semiconductor region; a first transistor having a first threshold voltage, the first transistor comprising a first gate stack comprising a first interfacial layer over the first semiconductor region, wherein the first interfacial layer has a first thickness, and the first interfacial layer comprises a first dipole dopant therein with a first dipole dopant concentration; and a first high-k dielectric layer over the first interfacial layer; and a second transistor having a second threshold voltage different from the first threshold voltage, the second transistor comprising a second gate stack comprising a second interfacial layer over the second semiconductor region, wherein the second interfacial layer has a second thickness different from the first thickness, and the second interfacial layer comprises a second dipole dopant therein with a second dipole dopant concentration, and the second dipole dopant concentration is different from the first dipole dopant concentration; and a second high-k dielectric layer over the second interfacial layer.

In an embodiment, the first dipole dopant has a first peak dopant concentration in middle of the first interfacial layer, and the second dipole dopant has a second peak dopant concentration in middle of the second interfacial layer, and wherein the first peak dopant concentration is different from the second peak dopant concentration. In an embodiment, both of the first transistor and the second transistor are p-type transistors or n-type transistors, and wherein the first dipole dopant and the second dipole dopant have opposite dipole dopant types. In an embodiment, the first high-k dielectric layer has a third thickness, and the second high-k dielectric layer has a fourth thickness different from the third thickness.

In an embodiment, the first high-k dielectric layer comprises a third dipole dopant having a third dipole dopant concentration, and the second high-k dielectric layer comprises a fourth dipole dopant having a fourth dipole dopant concentration, and wherein the fourth dipole dopant concentration is different from the third dipole dopant concentration. In an embodiment, the third dipole dopant in the first interfacial layer and the fourth dipole dopant in the second interfacial layer have opposite dipole dopant types.

In accordance with some embodiments, a device comprises a first semiconductor region and a second semiconductor region; a first transistor having a first threshold voltage, the first transistor comprising a first gate stack comprising a first interfacial layer; and a first high-k dielectric layer over the first interfacial layer, wherein the first high-k dielectric layer has a first thickness, and the first high-k dielectric layer comprises a first dipole dopant therein with a first dipole dopant concentration; and a second transistor having a same conductivity type as the first transistor, wherein the second transistor has a second threshold voltage different from the first threshold voltage, and the second transistor comprises a second gate stack comprising a second interfacial layer over the second semiconductor region; and a second high-k dielectric layer over the second interfacial layer, wherein the second high-k dielectric layer has a second thickness different from the first thickness, and the second high-k dielectric layer comprises a second dipole dopant therein with a second dipole dopant concentration different from the first dipole dopant concentration.

In an embodiment, the first interfacial layer and the second interfacial layer have different thicknesses. In an embodiment, the first interfacial layer and the second interfacial layer are doped with different dipole dopants having opposite dipole dopant types.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first gate stack for a first transistor, wherein the first transistor has a first threshold voltage, and wherein the forming the first gate stack comprises:

forming a first interfacial layer over a first semiconductor region, wherein the first interfacial layer has a first thickness;

performing a first doping process to dope a first dipole dopant into the first interfacial layer;

forming a first high-k dielectric layer over the first interfacial layer, wherein the first high-k dielectric layer has a second thickness; and performing a second doping process to dope a second dipole dopant into the first high-k dielectric layer;

forming a second gate stack for a second transistor, wherein the second transistor has a second threshold voltage different from the first threshold voltage, and wherein the forming the second gate stack comprises:

forming a second interfacial layer over a second semiconductor region, wherein the second interfacial layer has a third thickness; and forming a second high-k dielectric layer over the second interfacial layer, wherein the second high-k dielectric layer has a fourth thickness.

2. The method of claim 1, wherein the first interfacial layer and the second interfacial layer are formed by processes comprising:

forming a first mask layer covering the second semiconductor region;

forming the first interfacial layer using the first mask layer for masking;

forming a second mask layer covering the first semiconductor region; and forming the second interfacial layer using the second mask layer for masking.

3. The method of claim 1, wherein the first high-k dielectric layer and the second high-k dielectric layer are formed by processes comprising:

depositing the first high-k dielectric layer and the second high-k dielectric layer in a common deposition process;

forming a first mask layer covering the second high-k dielectric layer;

thinning the first high-k dielectric layer using the first mask layer for masking;

forming a second mask layer covering the first high-k dielectric layer; and thinning the second high-k dielectric layer using the second mask layer for masking.

4. The method of claim 1, wherein the first transistor differs from the second transistor by a difference between the first thickness of the first interfacial layer and the third thickness of the second interfacial layer, and wherein the method further comprises:

forming p-type work function layers over the first high-k dielectric layer and the second high-k dielectric layer.

5. The method of claim 1, wherein the first transistor differs from the second transistor by a difference between the third thickness of the first high-k dielectric layer and the fourth thickness of the second high-k dielectric layer, and wherein the method further comprises:

forming n-type work function layers over the first high-k dielectric layer and the second high-k dielectric layer.

6. The method of claim 1, wherein the first transistor differs from the second transistor by a difference between first dopants of the first interfacial layer and the second interfacial layer.

7. The method of claim 6, wherein the first dipole dopant has a first dipole dopant concentration, and the method further comprises doping the second interfacial layer with a third dipole dopant having a third dipole dopant concentration different from the first dipole dopant concentration.

8. The method of claim 6, wherein the first dipole dopant has a first dipole dopant type, and the method further comprises doping the second interfacial layer with a third dipole dopant having a second dipole dopant type opposite the first dipole dopant type.

9. The method of claim 1, wherein the first transistor differs from the second transistor by a difference between dopants of the first high-k dielectric layer and the second high-k dielectric layer.

10. The method of claim 1, wherein the first doping process and the second doping process are performed using different mask layers.

11. The method of claim 1 further comprising:

performing a third doping process to dope a third dipole dopant into the second interfacial layer; and performing a fourth doping process to dope a fourth dipole dopant into the second high-k dielectric layer.

12. A device comprising:

a first semiconductor region and a second semiconductor region;

a first transistor having a first threshold voltage, the first transistor comprising a first gate stack comprising:

a first interfacial layer over the first semiconductor region, wherein the first interfacial layer has a first thickness, and the first interfacial layer comprises a first dipole dopant therein with a first dipole dopant concentration, and wherein the first dipole dopant has a first peak dopant concentration in middle of the first interfacial layer; and a first high-k dielectric layer over the first interfacial layer; and a second transistor having a second threshold voltage different from the first threshold voltage, the second transistor comprising a second gate stack comprising:

a second interfacial layer over the second semiconductor region, wherein the second interfacial layer has a second thickness different from the first thickness, and the second interfacial layer comprises a second dipole dopant therein with a second dipole dopant concentration, wherein the second dipole dopant has a second peak dopant concentration in middle of the second interfacial layer, and wherein the first peak dopant concentration is different from the second peak dopant concentration; and a second high-k dielectric layer over the second interfacial layer.

13. The device of claim 12, wherein both of the first transistor and the second transistor are p-type transistors or n-type transistors, and wherein the first dipole dopant and the second dipole dopant have opposite dipole dopant types.

14. The device of claim 12, wherein the first high-k dielectric layer has a third thickness, and the second high-k dielectric layer has a fourth thickness different from the third thickness.

15. The device of claim 12, wherein the first high-k dielectric layer comprises a third dipole dopant having a third dipole dopant concentration, and the second high-k dielectric layer comprises a fourth dipole dopant having a fourth dipole dopant concentration, and wherein the fourth dipole dopant concentration is different from the third dipole dopant concentration.

16. The device of claim 15, wherein the third dipole dopant in the first interfacial layer and the fourth dipole dopant in the second interfacial layer have opposite dipole dopant types.

17. A device comprising:

a first semiconductor region and a second semiconductor region;

a first transistor having a first threshold voltage, the first transistor comprising a first gate stack comprising:

a first interfacial layer, wherein the first interfacial layer comprises a first dipole dopant, and a first peak concentration of the first dipole dopant is at a first intermediate level between a top surface and a bottom surface of the first interfacial layer; and a first high-k dielectric layer over the first interfacial layer, wherein the first high-k dielectric layer has a first thickness, and the first high-k dielectric layer comprises a second dipole dopant therein, wherein a second peak concentration of the second dipole dopant is at a second intermediate level between a top surface and a bottom surface of the first high-k dielectric layer; and a second transistor having a same conductivity type as the first transistor, wherein the second transistor has a second threshold voltage different from the first threshold voltage, and the second transistor comprises a second gate stack comprising:

a second interfacial layer over the second semiconductor region; and a second high-k dielectric layer over the second interfacial layer, wherein the second high-k dielectric layer has a second thickness different from the first thickness, and the second high-k dielectric layer comprises a third dipole dopant therein.

18. The device of claim 17, wherein the first interfacial layer and the second interfacial layer have different thicknesses.

19. The device of claim 17, wherein the first interfacial layer and the second interfacial layer are doped with different dipole dopants having opposite dipole dopant types.

20. The device of claim 17, wherein the first dipole dopant is different from the second dipole dopant.

* * * * *